(12) United States Patent
Takano et al.

(10) Patent No.: US 8,941,088 B2
(45) Date of Patent: Jan. 27, 2015

(54) NONVOLATILE MEMORY WITH RESISTANCE CHANGE LAYER

(71) Applicant: Kabushiki Kaisha Toshiba, Tokyo (JP)

(72) Inventors: Kensuke Takano, Kanagawa-ken (JP);
Yoshio Ozawa, Kanagawa-ken (JP);
Katsuyuki Sekine, Mie-ken (JP);
Junichi Wada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/038,796

(22) Filed: Sep. 27, 2013

(65) Prior Publication Data

US 2014/0021430 A1 Jan. 23, 2014

Related U.S. Application Data

(63) Continuation of application No. 12/728,579, filed on Mar. 22, 2010, now Pat. No. 8,569,728.

(30) Foreign Application Priority Data

Jun. 10, 2009 (JP) ................................ 2009-139529

(51) Int. Cl.
*H01L 29/02* (2006.01)
*H01L 45/00* (2006.01)
(Continued)

(52) U.S. Cl.
CPC ............ *H01L 45/12* (2013.01); *G11C 11/5685* (2013.01); *H01L 27/2436* (2013.01); *H01L 27/2481* (2013.01); *H01L 45/08* (2013.01); *H01L 45/1233* (2013.01); *H01L 45/146* (2013.01); *H01L 45/1608* (2013.01); *H01L 45/1666* (2013.01); *G11C 13/0007* (2013.01);
(Continued)

(58) Field of Classification Search
CPC ......... H01L 45/00; H01L 45/10; H01L 45/12; H01L 45/14; H01L 45/141; H01L 45/146; H01L 45/16; H01L 45/04; H01L 45/06
See application file for complete search history.

(56) References Cited

U.S. PATENT DOCUMENTS 7,692,178 B2 * 4/2010 Kawashima et al. ............. 257/5
2006/0170027 A1 * 8/2006 Lee et al. ....................... 257/314
(Continued)

FOREIGN PATENT DOCUMENTS

JP 2007-184419 7/2007
WO WO 2009125777 A1 10/2009

OTHER PUBLICATIONS

Wei et al., "Highly Reliable $TaO_x$ ReRAM and Direct Evidence of Redox Reaction Mechanism", IEDM Tech. Dig. (2008), pp. 293-296.
Notification of Reason(s) for Refusal issued by the Japanese Patent Office on Jun. 19, 2013, for Japanese Patent Application No. 2009-139529, and English-language translation thereof.

*Primary Examiner* — Selim Ahmed
(74) *Attorney, Agent, or Firm* — Finnegan, Henderson, Farabow, Garrett & Dunner, L.L.P.

(57) ABSTRACT

A nonvolatile memory device includes: a first conductive layer; a second conductive layer; a first resistance change layer provided between the first conductive layer and the second conductive layer and having an electrical resistance changing with at least one of an applied electric field and a passed current; and a first lateral layer provided on a lateral surface of the first resistance change layer and having an oxygen concentration higher than an oxygen concentration in the first resistance change layer.

17 Claims, 26 Drawing Sheets

(51) Int. Cl.
*G11C 11/56* (2006.01)
*H01L 27/24* (2006.01)
*G11C 13/00* (2006.01)

(52) U.S. Cl.
CPC ........ *G11C 2213/15* (2013.01); *G11C 2213/32* (2013.01); *G11C 2213/34* (2013.01); *G11C 2213/71* (2013.01)
USPC ...................................... 257/2; 257/E45.003

(56) References Cited

U.S. PATENT DOCUMENTS

| | | |
|---|---|---|
| 2009/0014710 A1 | 1/2009 | Kawashima et al. |
| 2009/0121208 A1 | 5/2009 | Nagashima et al. |
| 2010/0155687 A1* | 6/2010 | Reyes et al. ........................ 257/4 |
| 2010/0200852 A1 | 8/2010 | Kawashima et al. |
| 2011/0001110 A1 | 1/2011 | Takahashi |

* cited by examiner

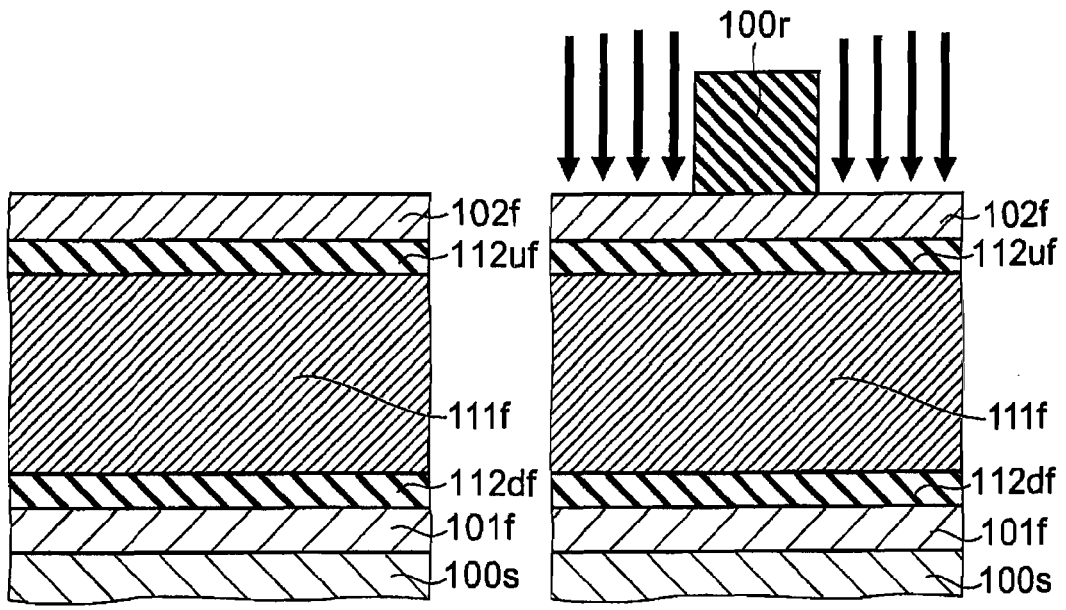
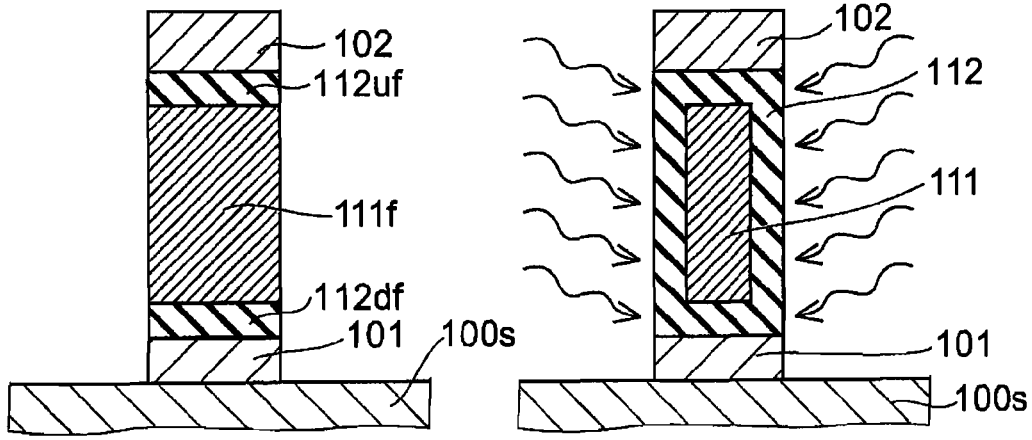
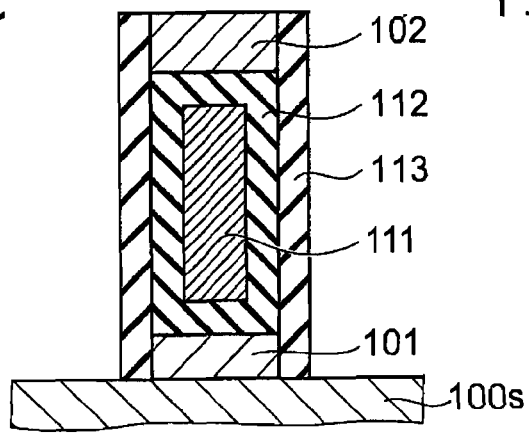
FIG. 11A
FIG. 11B
FIG. 11C
FIG. 11D
FIG. 11E

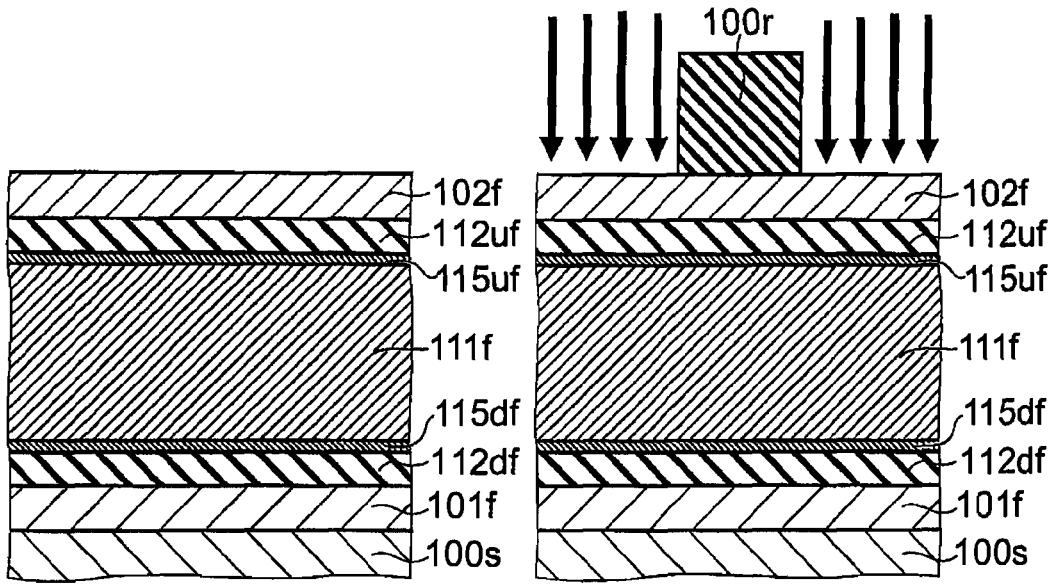
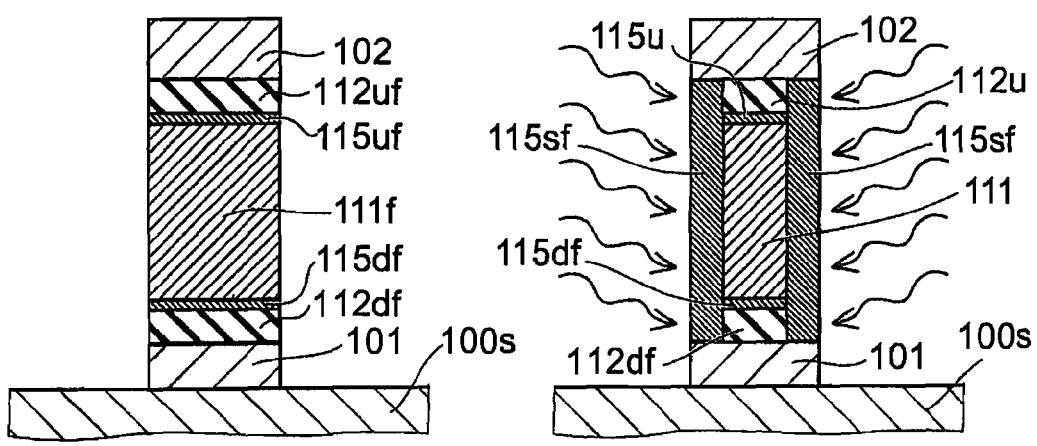
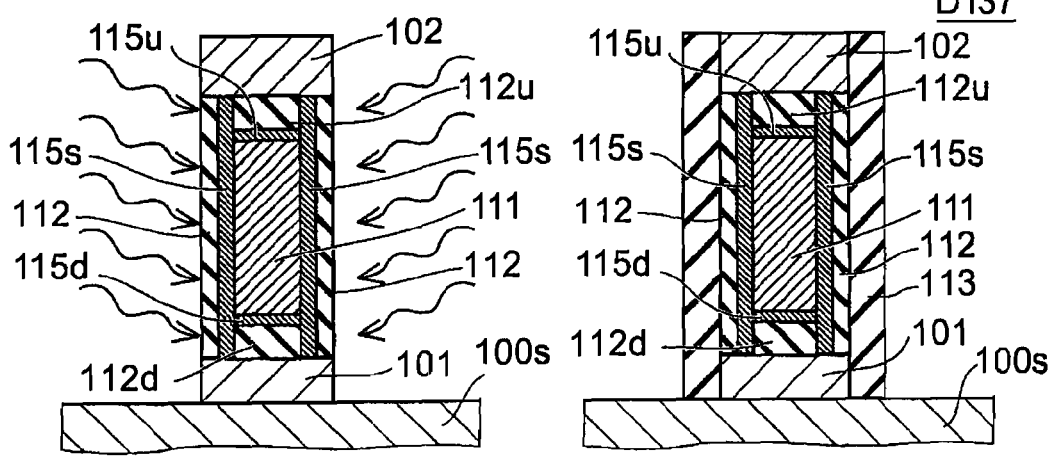
FIG. 13A  FIG. 13B  FIG. 13C  FIG. 13D  FIG. 13E  FIG. 13F

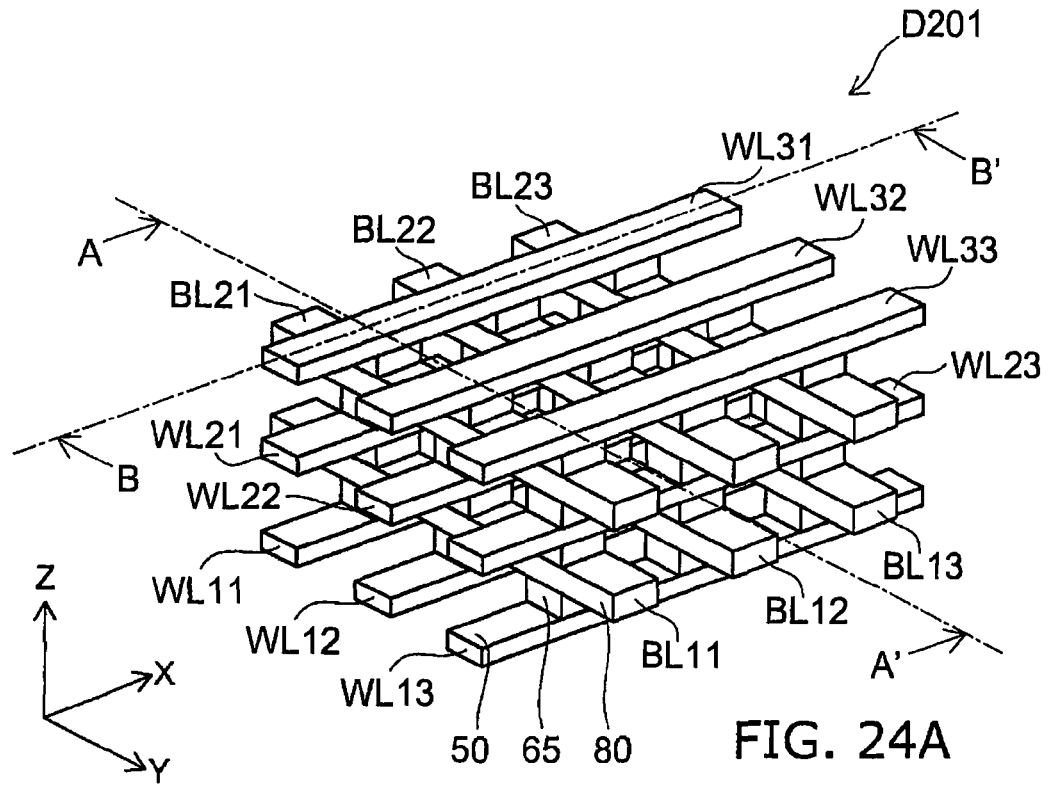
FIG. 24A
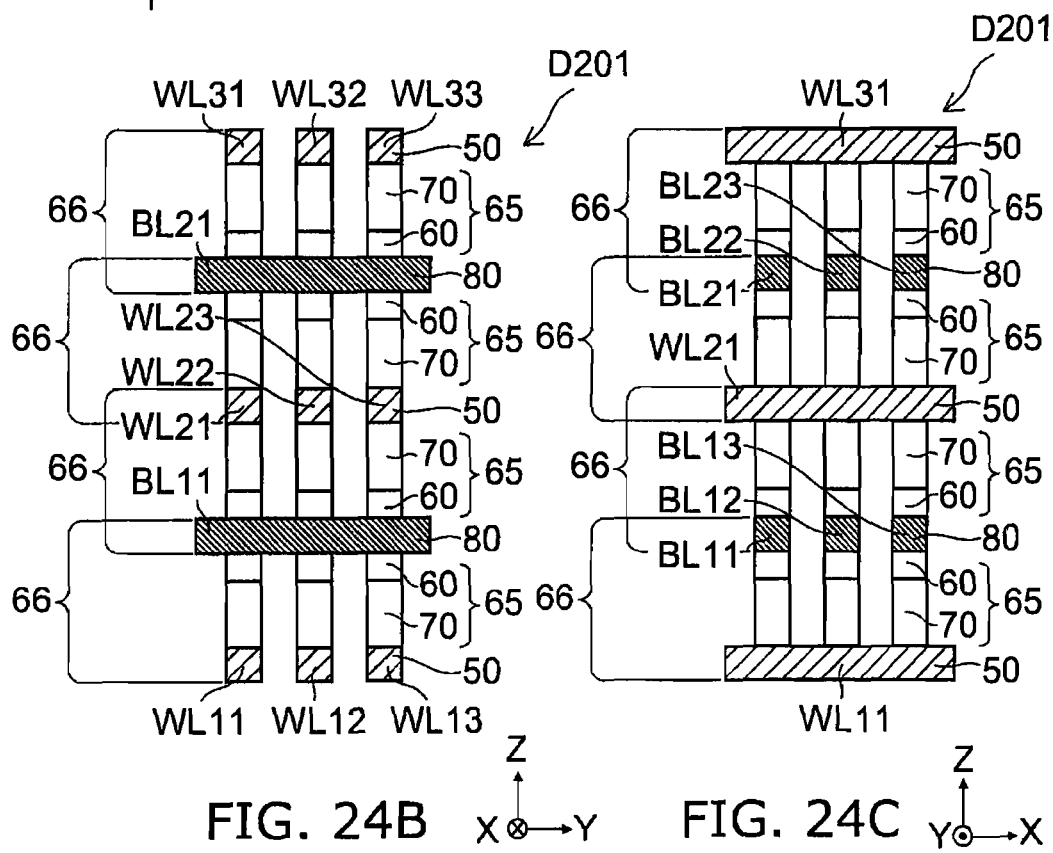
FIG. 24B
FIG. 24C

NONVOLATILE MEMORY WITH RESISTANCE CHANGE LAYER

CROSS-REFERENCE TO RELATED APPLICATIONS

This is a continuation of application Ser. No. 12/728,579, filed Mar. 22, 2010, which is incorporated herein by reference.

This application is based upon and claims the benefit of priority from the prior Japanese Patent Application No. 2009-139529, filed on Jun. 10, 2009; the entire contents of which are incorporated herein by reference.

BACKGROUND

1. Field

Embodiments of the invention relate generally to a nonvolatile memory device and a method for manufacturing the same.

2. Background Art

A resistance change memory has been drawing attention as a next-generation nonvolatile memory because it is less prone to characteristics degradation despite downscaling, and easily increased in capacity (see, e.g., JP-A 2007-184419 (Kokai)).

The resistance change memory is based on the characteristics of a resistance change film whose resistance changes when a voltage is applied to and a current is passed in the resistance change film. Such a resistance change film is made of various oxides, such as oxides of transition metals.

Conventional resistance change films require an initialization process (forming) for decreasing the resistance thereof, and hence are inefficient. Furthermore, forming requires a high forming voltage, which may destroy the resistance change film. Moreover, the switching operation (reset operation) for switching from the low-resistance state to the high-resistance state requires a large current, which makes it difficult to reduce power consumption.

In this context, a method for facilitating the reset operation by using an oxygen-rich composition on the anode side of the resistance change film to advance anodic oxidation is proposed in Z. Wei, Y. Kanzawa, K. Arita, K. Katoh, K. Kawai, S. Muraoka, S. Mitani, S. Fujii, K. Katayama, M. Iijima, T. Mikawa, T. Ninomiya, R. Miyanaga, Y. Kawashima, K. Tsuji, A. Himeno, T. Okada, R. Azuma, K. Shimakawa, H. Sugaya, T. Takagi, R. Yasuhara, K. Horiba, H. Kumigashira, and M. Oshima, IEDM2008, pp. 293-296. However, even in this method, the reset current is not sufficiently reduced. In particular, with the downscaling of the device, the effect of reset current reduction is decreased, leaving room for improvement.

SUMMARY

According to an aspect of the invention, there is provided a nonvolatile memory device including: a first conductive layer; a second conductive layer; a first resistance change layer provided between the first conductive layer and the second conductive layer and having an electrical resistance changing with at least one of an applied electric field and a passed current; and a first lateral layer provided on a lateral surface of the first resistance change layer and having an oxygen concentration higher than an oxygen concentration in the first resistance change layer.

According to another aspect of the invention, there is provided a nonvolatile memory device including: a first conductive layer; a second conductive layer; a first resistance change layer provided between the first conductive layer and the second conductive layer and having an electrical resistance changing with at least one of an applied electric field and a passed current; and a first lateral layer provided on a lateral surface of the first resistance change layer and including an oxide of an element having a smaller absolute value of standard free energy of oxide formation than an element except oxygen contained in an oxide included in the first resistance change layer.

According to still another aspect of the invention, there is provided a method for manufacturing a nonvolatile memory device, including: stacking, on a substrate, a first conductive film serving as a first conductive layer, a resistance change film having electrical resistance changing with at least one of an applied electric field and a passed current, and a second conductive film serving as a second conductive layer; etching the first conductive film, the resistance change film, and the second conductive film to form a lateral surface of the resistance change film; and oxidizing the lateral surface to make an oxygen concentration on a side of the lateral surface higher than a oxygen concentration in a center portion of a cross section of the resistance change film cut along a plane perpendicular to a stacking direction of the stacking.

BRIEF DESCRIPTION OF THE DRAWINGS

FIGS. 11A to 11E are schematic cross-sectional views in order of the processes, illustrating a method for manufacturing a nonvolatile memory device according to the fourth embodiment;

FIGS. 13A to 13F are schematic cross-sectional views in order of the processes, illustrating a method for manufacturing another nonvolatile memory device according to the fifth embodiment;

FIGS. 24A to 24C are schematic views illustrating the configuration of a nonvolatile memory device according to a tenth embodiment;

DETAILED DESCRIPTION

Figure 1:
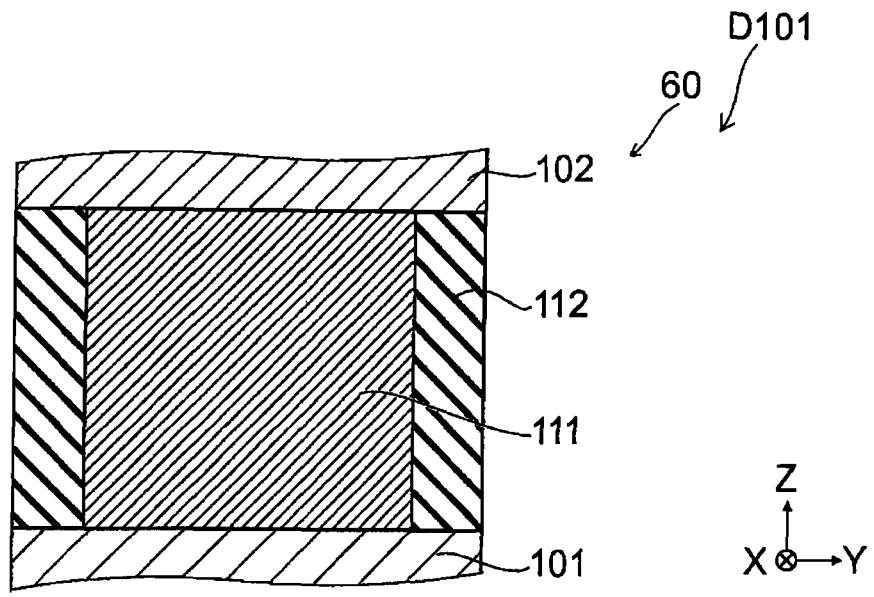
FIG. 1 is a schematic cross-sectional view illustrating the configuration of a nonvolatile memory device according to a first embodiment.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings of the application, the same components as those described previously with reference to earlier figures are labeled with like reference numerals, and the detailed description thereof is omitted as appropriate.

First Embodiment

FIG. 1 is a schematic cross-sectional view illustrating the configuration of a nonvolatile memory device according to a first embodiment of the invention.

A nonvolatile memory device D101 according to this embodiment is illustratively a cross-point nonvolatile memory device. The entire configuration of the cross-point nonvolatile memory device is described later. In the following, a description is given of a memory layer, which is a relevant part of the nonvolatile memory device. The memory layer constitutes one cell (memory unit) in the nonvolatile memory device D101.

As shown in FIG. 1, a memory layer 60 of the nonvolatile memory device D101 includes a first conductive layer 101, a second conductive layer 102, a resistance change layer 111 (first resistance change layer) provided between the first conductive layer 101 and the second conductive layer 102, and a lateral layer 112 (first lateral layer) provided on the lateral surface of the resistance change layer 111.

The resistance change layer 111 is a layer whose electrical resistance changes with at least one of the electric field applied thereto and the current passed therein.

The lateral layer 112 is a layer having a higher oxygen concentration than the resistance change layer 111.

The first conductive layer 101 and the second conductive layer 102 described above are interchangeable.

In the following, the stacking direction of the first conductive layer 101, the resistance change layer 111, and the second conductive layer 102 is referred to as a Z-axis direction. Furthermore, one of the directions perpendicular to the Z-axis direction is referred to as an X-axis direction, and the direction perpendicular to the Z-axis direction and the X-axis direction is referred to as a Y-axis direction.

The resistance change layer 111 is illustratively made of a metal oxide of a transition metal. The lateral layer 112 is made of a metal oxide containing the metallic element used in the resistance change layer 111 and having a higher oxygen concentration than the resistance change layer 111.

The resistance change layer 111 can illustratively be made of a binary metal oxide represented by $M_xO_y$ (where M is a transition metal element and O is oxygen), a ternary metal oxide represented by $A_\alpha M_\beta O_\gamma$ (where A and M are transition metal elements and O is oxygen), or a quaternary or higher metal oxide.

In the case where the resistance change layer 111 is made of $M_xO_y$, the lateral layer 112 can be made of $M_{x1}O_{y1}$ (y1>y). In the case where the resistance change layer 111 is made of $A_\alpha M_\beta O_\gamma$, the lateral layer 112 can be made of $A_{\alpha 1}M_{\beta 1}O_{\gamma 1}$ (γ1>γ).

Here, in the case where the resistance change layer 111 is made of $M_xO_y$, transition metals other than the transition metal M may be added to the lateral layer 112 in addition to $M_{x1}O_{y1}$ (y1>y). Likewise, in the case where the resistance change layer 111 is made of $A_\alpha M_\beta O_\gamma$, transition metals other than the transition metals A and M may be added to the lateral layer 112 in addition to $A_{\alpha 1}M_{\beta 1}O_{\gamma 1}$ (γ1>γ).

That is, it is only necessary that the oxygen concentration in the lateral layer 112 is higher than that in the resistance change layer 111. In other words, it is only necessary that the oxygen concentration in the lateral layer 112 is higher than that in the resistance change layer 111 so that the lateral layer 112 can release oxygen more easily than the resistance change layer 111 and supply oxygen to the resistance change layer 111.

For instance, the lateral layer 112 can be made of a metal oxide having a stoichiometric or nearly stoichiometric composition ratio, and the resistance change layer 111 can be made of the metal oxide with the proportion of oxygen reduced to 90% or less as compared with the lateral layer 112.

That is, the oxygen concentration in the lateral layer 112 is 111% or more of the oxygen concentration in the resistance change layer 111. For instance, in the case where the oxygen concentration in the lateral layer 112 is less than 111% of the oxygen concentration in the resistance change layer 111, the capacity for oxygen supply from the lateral layer 112 to the resistance change layer 111 is lowered, and the effect described later is decreased.

The resistance change layer 111 and the lateral layer 112 can illustratively be made of an oxide of at least one selected from Si, Ti, Ta, Nb, Hf, Zr, W, Al, Ni, Co, Mn, Fe, Cu, and Mo. Oxide of Al and oxide of Hf are stable and used widely.

On the other hand, the first conductive layer 101 and the second conductive layer 102 can be made of a material containing an element whose "standard free energy of oxide formation" has a smaller absolute value than that of the element except oxygen contained in the oxide included in the resistance change layer 111. This material can include a metal made of a second element whose "standard free energy of oxide formation" has a smaller absolute value than that of a first element except oxygen contained in the oxide included in the resistance change layer 111, and an alloy, oxide, nitride, and oxynitride containing the second element.

The first conductive layer 101 and the second conductive layer 102 can be made of a metal such as W, Ta, and Cu, and a metal nitride or carbide such as TiN, TaN, and WC.

Furthermore, the first conductive layer 101 and the second conductive layer 102 can also be made of a semiconductor and the like, such as highly doped silicon.

Figure 2:
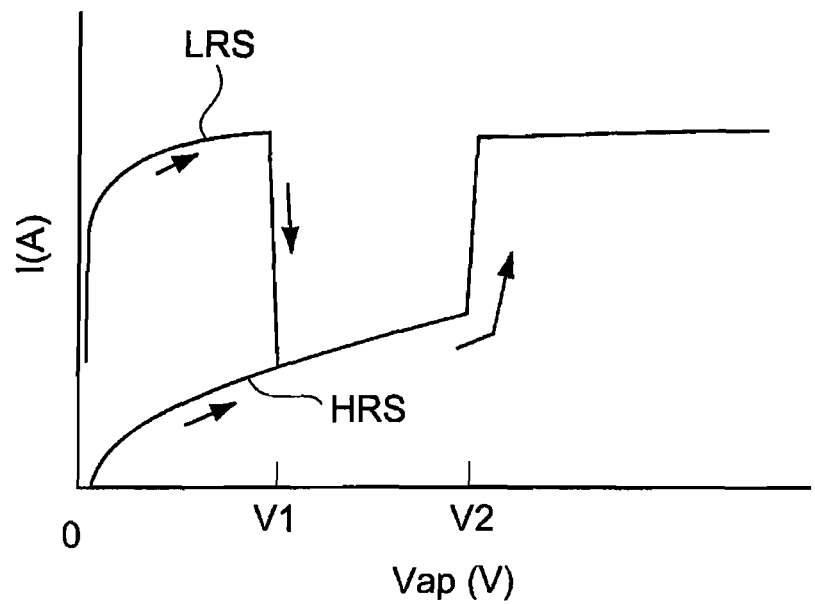
FIG. 2 is a schematic view illustrating characteristics of the nonvolatile memory device according to the first embodiment.

FIG. 2 is a schematic view illustrating characteristics of the nonvolatile memory device according to the first embodiment of the invention.

In FIG. 2, the horizontal axis represents the applied voltage Vap applied to the resistance change layer 111 (i.e., the potential difference between the first conductive layer 101 and the second conductive layer 102), and the vertical axis represents the current I flowing in the resistance change layer 111 (i.e., the current flowing between the first conductive layer 101 and the second conductive layer 102).

As shown in FIG. 2, it is illustratively assumed that the resistance change layer 111 is in the high-resistance state HRS. If the applied voltage Vap is increased in the high-resistance state HRS, then at a second transition voltage V2 (set voltage), a transition occurs from the high-resistance state HRS to the low-resistance state LRS in which the resistance is relatively low. This low-resistance state LRS is maintained even if the applied voltage Vap is turned off. In the low-resistance state LRS, if the applied voltage V is increased from 0 volts, then at a first transition voltage V1 (reset voltage), a transition to the high-resistance state HRS occurs.

Such a plurality of resistance states in the resistance change layer 111 are used for memory operation. The resistance state (memory state) can be read by applying an applied voltage Vap lower than the first transition voltage V1 to the resistance change layer 111.

The transition from the high-resistance state HRS to the low-resistance state LRS is referred to as set (or set operation), and the transition from the low-resistance state LRS to the high-resistance state HRS is referred to as reset (or reset operation).

It is noted that multivalued data can also be realized illustratively by establishing two or more limit current values, and the nonvolatile memory device D101 can also be used as a multivalued memory.

Although FIG. 2 illustrates the characteristics for the case where a DC voltage is applied to the memory layer 60, a pulse voltage can be applied to the memory layer 60 to operate the nonvolatile memory device D101.

Figure 3A:
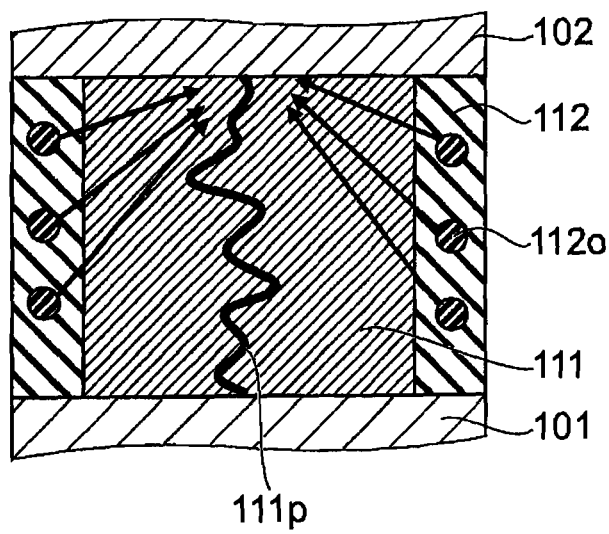
FIGS. 3A and 3B are schematic cross-sectional views illustrating the characteristics of the nonvolatile memory device according to the first embodiment.
Figure 3B:
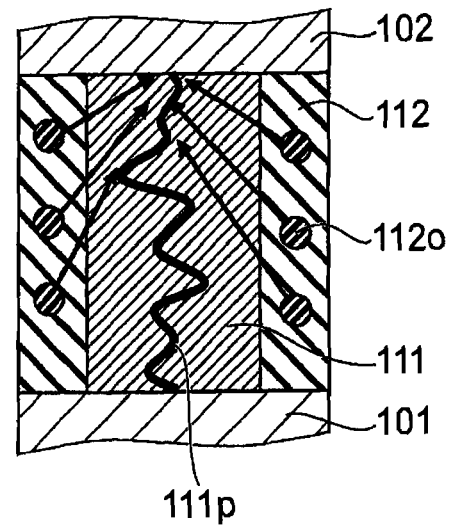

FIGS. 3A and 3B are schematic cross-sectional views illustrating the characteristics of the nonvolatile memory device according to the first embodiment of the invention.

More specifically, FIG. 3A illustrates the reset operation in the nonvolatile memory device D101, and FIG. 3B illustrates the reset operation for a finer device than in FIG. 3A. In the following example, a description is given of the case where the first conductive layer 101 is a cathode and the second conductive layer 102 is an anode.

As shown in FIG. 3A, a filament 111p is formed in the resistance change layer 111 illustratively through a forming process. More specifically, for instance, after the memory layer 60 is formed, a voltage (forming voltage) of a prescribed value or more is applied to the resistance change layer 111 via the first conductive layer 101 and the second conductive layer 102 to form a filament 111p. This filament 111p serves as a current path in the resistance change layer 111 in the low-resistance state LRS.

In the reset operation, it is considered that the transition from the low-resistance state LRS to the high-resistance state HRS occurs by, for instance, anodic oxidation of the filament 111p. On the other hand, in the set operation, it is considered that the transition from the high-resistance state HRS to the low-resistance state LRS occurs by, for instance, reduction of the insulating portion of the oxidized filament 111p.

Here, in the nonvolatile memory device D101, if a voltage higher than the first transition voltage V1 is applied in the low-resistance state LRS, then for instance, in the neighborhood of the second conductive layer 102 serving as an anode, oxygen 112o is supplied from the lateral layer 112 to the resistance change layer 111, accelerating oxidation of the resistance change layer 111. This facilitates the transition (reset) from the low-resistance state LRS to the high-resistance state HRS in the resistance change layer 111. Thus, the lateral layer 112 serves to supply oxygen 112o to the resistance change layer 111.

Furthermore, as shown in FIG. 3B, even for a fine cell with a reduced cell area (cross-sectional area of the resistance change layer 111 cut along a plane perpendicular to the stacking direction of the first conductive layer 101, the resistance change layer 111, and the second conductive layer 102), the function of the lateral layer 112 for supplying oxygen 112o to the resistance change layer 111 is not lowered. The plane perpendicular to the stacking direction may correspond to a plane parallel to a substrate on which the nonvolatile memory device is formed. Hence, despite cell downscaling, the transition (reset) from the low-resistance state LRS to the high-resistance state HRS is easily performed.

In contrast, for instance, in the configuration of a comparative example as described in the aforementioned document by Z. Wei et al. in which an oxygen supply layer rich in oxygen is provided on the anode side of the resistance change layer, the volume of the oxygen supply layer decreases with the progress of cell downscaling. Hence, in the comparative example, particularly when downscaled, it is difficult to supply oxygen to the resistance change layer 111 at reset time.

Thus, the reset current increases and may destroy, for instance, the driving circuit element and protection circuit element.

In contrast, in the memory layer 60 of the nonvolatile memory device D101 according to this embodiment, the lateral layer 112 being rich in oxygen and having an oxygen supply function is provided on the lateral surface of the resistance change layer 111. Thus, downscaling of the cell does not result in decreasing the volume of the lateral layer 112. This facilitates resetting and can reduce the reset current and power consumption.

Furthermore, the composition of the resistance change layer 111 can be richer in metal than in the case where no lateral layer 112 is provided, and hence the forming voltage can be reduced. Furthermore, as described later, depending on the ratio of size (volume) between the resistance change layer 111 and the lateral layer 112, the forming process can be omitted.

Thus, in the nonvolatile memory device D101, the efficiency of forming can be improved by reducing the forming voltage or omitting the forming process. Hence, a resistance change nonvolatile memory device with reduced reset current can be realized.

Furthermore, in the nonvolatile memory device D101, resetting is facilitated, and hence the reset operation can be accelerated simultaneously.

Furthermore, because of the easy reset operation, the first transition voltage V1 (reset voltage) can be reduced.

Simultaneously, because of the easy reset operation, the filament 111p is stably insulated, which requires a large electric field for the set operation. Consequently, the second transition voltage V2 (set voltage) can be kept constant or increased. This serves to increase the difference between the reset voltage (e.g., first transition voltage V1) and the set voltage (e.g., second transition voltage V2), expand the driving margin, and suppress malfunctions.

It is noted that the width of the lateral layer 112 (the length of the lateral layer 112 in a direction perpendicular to the Z-axis direction) is preferably 1 nm (nanometer) or more from the viewpoint of the amount of oxygen supply from the lateral layer 112 toward the resistance change layer 111. That is, in the case where the width of the lateral layer 112 is smaller (narrower) than 1 nm, the amount of oxygen supply from the lateral layer 112 toward the resistance change layer 111 is small, hence decreasing the effect of improving the efficiency of forming, such as reduction of the forming voltage, and the effect of reducing the reset current.

FIGS. 4A to 4D are schematic cross-sectional views in order of the processes, illustrating a method for manufacturing a nonvolatile memory device according to the first embodiment of the invention.

Figures 4A, 4B:
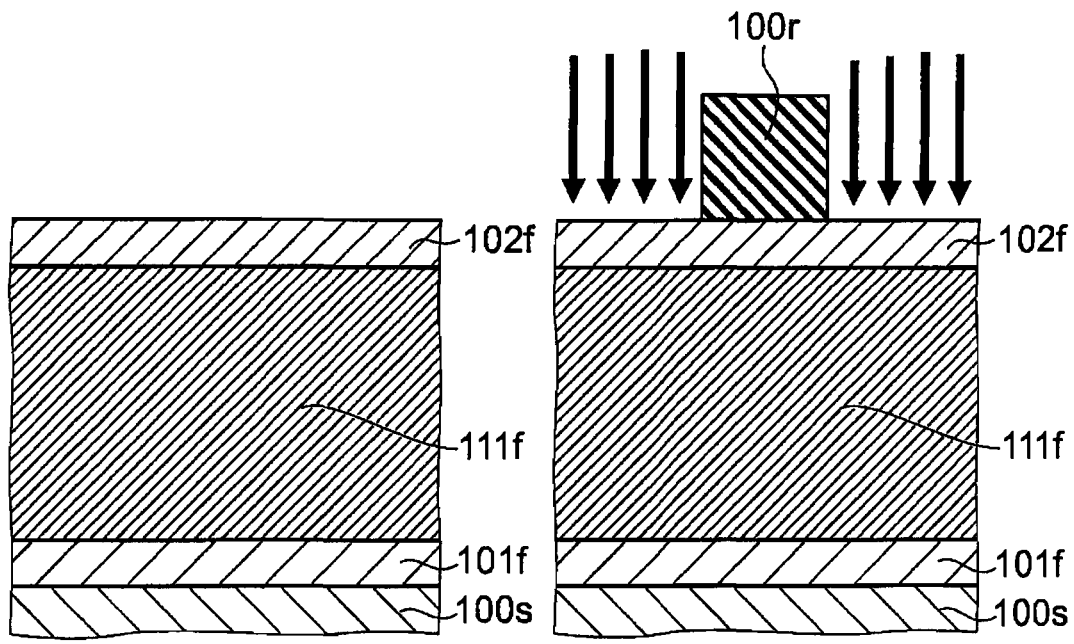
FIGS. 4A to 4D are schematic cross-sectional views in order of the processes, illustrating a method for manufacturing the nonvolatile memory device according to the first embodiment.

As shown in FIG. 4A, a first conductive film 101f, which serves as a first conductive layer 101, is formed illustratively on a substrate 100s. The first conductive film 101f can be made of the aforementioned metals and the aforementioned conductive metal compounds, and any process such as the sputtering process, the CVD (chemical vapor deposition) process, and the ALD (atomic layer deposition) process is applicable thereto.

Next, a resistance change film 111f to serve as a resistance change layer 111 is formed. The resistance change film 111f is made of a metal oxide rich in metal. This film formation can be based on any process such as the sputtering process, the CVD process, and the ALD process. For instance, in the case of using the sputtering process, it may be reactive sputtering in which sputtering is performed with oxygen introduced into the chamber, or oxidation treatment may be performed after sputtering a metal film. In this case, a desired composition is obtained by controlling, for instance, the oxygen flow rate and oxidation temperature. In the case of using the CVD or ALD process, a desired composition is obtained by controlling, for instance, the film formation temperature, the flow rate and time of the oxidizer, and the flow rate and time of the metal precursor.

Next, a second conductive film 102f, which serves as a second conductive layer 102, is formed. This film formation can also be based on any process such as the sputtering process, the CVD process, and the ALD process.

Here, the aforementioned substrate 100s can be a semiconductor substrate provided with various control circuits and the like. In the case where a plurality of constituent memory layers including the memory layer 60 are stacked, the substrate 100s is made of the constituent memory layer(s) below the constituent memory layer of interest. As described later, at least one of the first conductive film 101f and the second conductive film 102f may be a film serving as at least one of a rectifying element, a word line (first wiring), and a bit line (second wiring). In the following, by way of example, a description is given of the case where the first conductive film 101f and the second conductive film 102f are provided independently of the rectifying element, word line, and bit line.

Next, as shown in FIG. 4B, a mask 100r is formed on the second conductive film 102f by photolithography, and the second conductive film 102f, the resistance change film 111f, and the first conductive film 101f are processed illustratively by RIE (reactive ion etching).

Figures 4C, 4D:
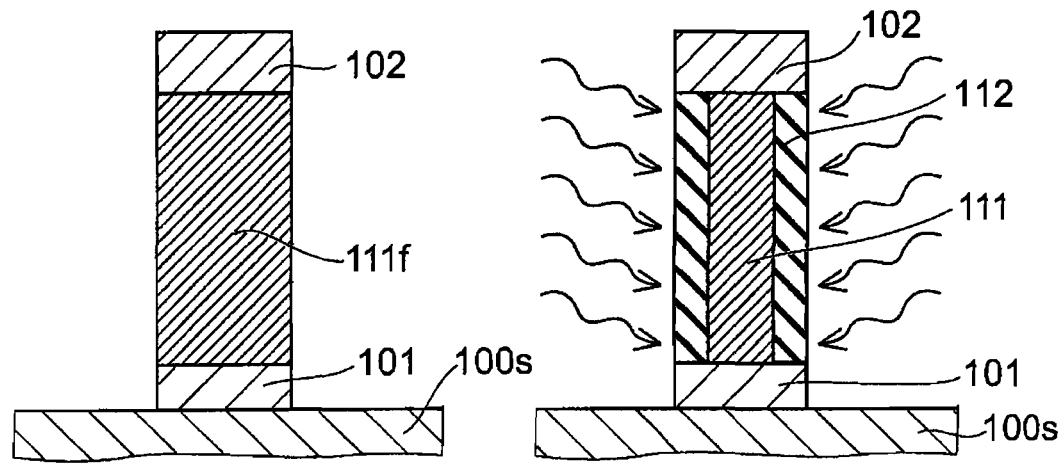

Thus, as shown in FIG. 4C, a first conductive layer 101 and a second conductive layer 102 can be formed, resulting in a configuration in which the resistance change film 111f serving as a resistance change layer 111 is provided therebetween. That is, the lateral surface of the resistance change film 111f is formed.

Here, in the case where a plurality of constituent memory layers are vertically stacked, in the vertically adjacent memory layers 60, the lateral surface of the lower memory layer 60 in the X-axis direction and the lateral surface of one of the word line and the bit line in, for instance, the X-axis direction can be processed simultaneously with the lateral surface of the upper memory layer 60 in the X-axis direction. In the following, a description is given with a focus on only the memory layer 60.

Then, as shown in FIG. 4D, the lateral surface of the resistance change film 111f is oxidized. More specifically, the resistance change film 111f is annealed in an oxidizing atmosphere to form a lateral layer 112 on the lateral surface of the resistance change film 111f. The center portion of the resistance change film 111f constitutes a resistance change layer 111. The lateral layer 112 having a higher oxygen concentration than the resistance change layer 111 is formed on the lateral surface of the resistance change layer 111.

In this process, preferably, the first conductive layer 101 and the second conductive layer 102 are not oxidized, and the lateral surface of the resistance change film 111f is selectively oxidized. In this process, for instance, it is possible to use thermal oxidation performed in an atmosphere of water and hydrogen at a temperature of 600° C. or more. It is also possible to use radical oxidation performed in a hydrogen atmosphere at a temperature of 600° C. or more with a trace amount of oxygen added thereto. Furthermore, it is also possible to use plasma oxidation performed in a hydrogen atmosphere at a temperature of 600° C. or less with a trace amount of oxygen added thereto.

Furthermore, this process can repair the damage caused to the lateral surface of the cell in the process of etching the cell described with reference to FIGS. 4B and 4C.

Thus, the nonvolatile memory device D101 illustrated in FIG. 1 can be fabricated.

In the nonvolatile memory device D101 according to this embodiment, a clear boundary does not need to exist between the resistance change layer 111 and the lateral layer 112. That is, in the resistance change layer, it is only necessary that the oxygen concentration is relatively higher on the lateral side than in the center portion in the plane (X-Y plane) perpendicular to the stacking direction (Z-axis direction). Thus, the lateral layer can also be regarded as a portion on the lateral side of the resistance change layer where the oxygen concentration is relatively high.

Furthermore, the lateral layer 112 does not necessarily need to be provided on the lateral surfaces in all directions of the resistance change layer 111, but only needs to be provided at least part of the lateral surfaces of the resistance change layer 111.

In this example, the lateral layer 112 is also provided between the first conductive layer 101 and the second conductive layer 102. However, the lateral layer 112 only needs to be provided on the lateral surface of the resistance change layer 111. For instance, part of the lateral layer 112 may be opposed to at least part of the lateral surface of the first conductive layer 101 and the lateral surface of the second conductive layer 102.

Furthermore, at least part of the lateral layer 112 may be provided between the first conductive layer 101 and the second conductive layer 102.

Furthermore, the lateral layer 112 only needs to function as an oxygen supply layer for the resistance change layer 111. The electrical resistance of the lateral layer 112 may or may not change with at least one of the electric field applied to and the current passed in the lateral layer 112. That is, the lateral layer 112 is arbitrary in the change of its electrical resistance.

Thus, the lateral layer 112 functions as an oxygen supply layer for the resistance change layer 111 and has a higher electrical resistance than the resistance change layer 111.

Second Embodiment

Figure 5:
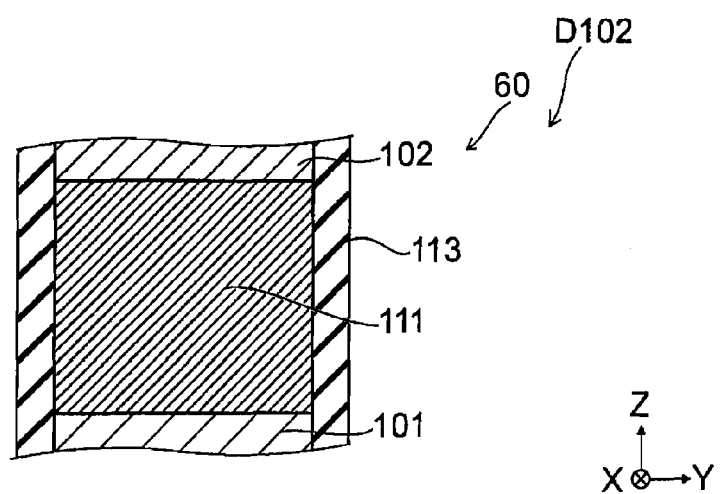
FIG. 5 is a schematic cross-sectional view illustrating the configuration of a nonvolatile memory device according to a second embodiment.

FIG. 5 is a schematic cross-sectional view illustrating the configuration of a nonvolatile memory device according to a second embodiment of the invention.

As shown in FIG. 5, a memory layer 60 in a nonvolatile memory device D102 includes a first conductive layer 101, a second conductive layer 102, a resistance change layer 111 (first resistance change layer) provided between the first conductive layer 101 and the second conductive layer 102, and a lateral layer 113 provided on the lateral surface of the resistance change layer 111.

The resistance change layer 111 is a layer whose electrical resistance changes with at least one of the electric field applied thereto and the current passed therein, and can be made of the materials described with reference to the first embodiment. The first and second conductive layers 101 and 102 can also be made of the materials described with reference to the first embodiment.

The lateral layer 113 is a layer including an oxide of an element whose "standard free energy of oxide formation" has a smaller absolute value than that of the element except oxygen contained in the oxide included in the resistance change layer 111. In the following, for simplicity, the "oxide of an element whose 'standard free energy of oxide formation' has a smaller absolute value than that of the element except oxygen contained in the oxide included in the resistance change layer" may be abbreviated as "oxide having a lower free energy of formation than the resistance change layer".

The resistance change layer 111 can illustratively be made of an oxide of Ti, and the lateral layer 113 can illustratively be made of an oxide of Si.

Because Si used in the lateral layer 113 has a smaller absolute value of the "standard free energy of oxide formation" than Ti used in the resistance change layer 111, the lateral layer 113 functions as an oxygen supply layer for the resistance change layer 111.

Like the lateral layer 112 in the nonvolatile memory device D101, the lateral layer 113 in the nonvolatile memory device D102 is provided on the lateral surface of the resistance change layer 111. Thus, downscaling of the cell does not result in decreasing the volume of the lateral layer 113. This facilitates resetting, and can reduce the reset current and power consumption.

Furthermore, because the resistance change layer 111 is easily oxidized by the lateral layer 113, the resistance change layer 111 can initially have a composition with high conductivity. Consequently, the forming voltage can be reduced. Furthermore, it is also possible to omit the forming process.

Thus, in the nonvolatile memory device D102, the efficiency of forming is improved by reducing the forming voltage or omitting the forming process. Hence, a resistance change nonvolatile memory device with reduced reset current can be realized.

Furthermore, in the nonvolatile memory device D102, as in the nonvolatile memory device D101, the reset operation can be accelerated, the difference between the reset voltage and the set voltage can be increased, and malfunctions can be suppressed.

In this embodiment, it is only necessary that the lateral layer 113 includes an oxide having a lower free energy of formation than the resistance change layer 111. The resistance change layer 111 and the lateral layer 113 are not limited to binary compounds, but may be made of ternary or higher compounds.

The absolute value of the "standard free energy of oxide formation" of the element except oxygen in the oxide included in the lateral layer 113 (the element except oxygen contained in the oxide) is set smaller than the absolute value of the "standard free energy of oxide formation" of the element except oxygen in the oxide included in the resistance change layer 111. Here, if the difference between these values (these absolute values) increases, the effect of supplying oxygen from the lateral layer 113 to the resistance change layer 111 is enhanced, which further facilitates resetting, and consequently increases the effect of reducing the forming voltage. On the other hand, if the difference between these values is small, the degree of facilitating resetting is relatively small, whereas setting becomes easier.

Thus, while the absolute value of the "standard free energy of oxide formation" of the element except oxygen in the oxide included in the lateral layer 113 is set smaller than the absolute value of the "standard free energy of oxide formation" of the element except oxygen in the oxide included in the resistance change layer 111, the difference between these values can be suitably adapted to desired characteristics.

In the foregoing description, the reset operation and the set operation are performed on the basis of the reduction and oxidation of the filament 111p, for instance, serving as a current path of the resistance change layer 111. However, the set operation may be performed on the basis of the electric field applied to the resistance change layer 111. In this case, the difference between the absolute value of the "standard free energy of oxide formation" of the element except oxygen in the oxide included in the lateral layer 113 and the absolute value of the "standard free energy of oxide formation" of the element except oxygen in the oxide included in the resistance change layer 111 is preferably increased so that the reset operation can be facilitated without substantially exerting an adverse effect on the set operation.

FIGS. 6A to 6D are schematic cross-sectional views in order of the processes, illustrating a method for manufacturing a nonvolatile memory device according to the second embodiment of the invention.

Figures 6A, 6B:
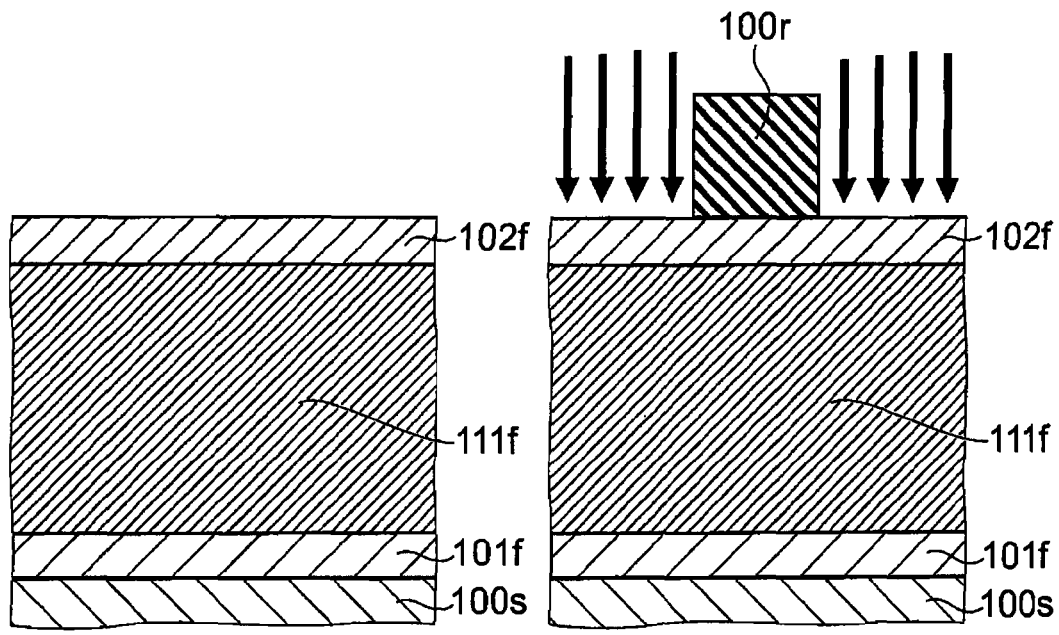
FIGS. 6A to 6D are schematic cross-sectional views in order of the processes, illustrating a method for manufacturing the nonvolatile memory device according to the second embodiment.
Figures 6C, 6D:
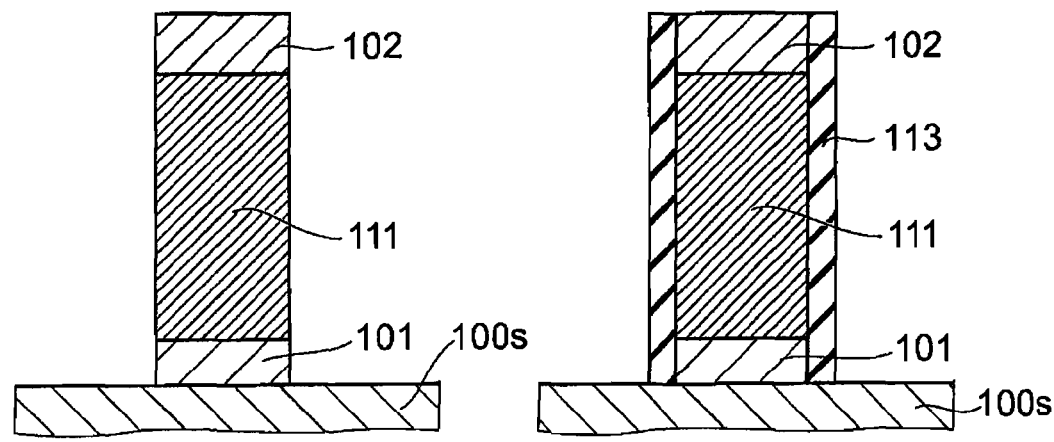

The process from FIG. 6A to FIG. 6C is similar to that for the nonvolatile memory device D101, and hence the description thereof is omitted.

After the first conductive layer 101, the second conductive layer 102, and the resistance change layer 111 are formed, as shown in FIG. 6D, a silicon oxide film, for instance, which serves as a lateral layer 113 having the function of an oxygen supply layer, is formed on the lateral surfaces and upper surfaces of the first conductive layer 101, the second conductive layer 102, and the resistance change layer 111. This film formation can illustratively be based on the ALD film formation at a low temperature of 400° C. or less using 3DMAS (tris(dimethylamino)silane) and ozone. In this case, a film capable of easily supplying oxygen can be formed illustratively by using a condition in which the proportion of 3DMAS is decreased and ozone is increased as compared with the film formation condition for a silicon oxide film serving as an interlayer insulating film.

The lateral layer 113 is preferably made of a silicon oxide film, which easily supplies oxygen. Specifically, it is possible to choose a film with the composition ratio of oxygen to silicon being approximately 2 or more.

The width of the lateral layer 113 (the length of the lateral layer 113 in a direction perpendicular to the Z-axis direction) is preferably 1 nm or more from the viewpoint of the amount of oxygen supply from the lateral layer 113 toward the resistance change layer 111. That is, in the case where the width of the lateral layer 113 is smaller than 1 nm, the amount of oxygen supply from the lateral layer 113 toward the resistance change layer 111 is small, hence decreasing the effect such as reduction of the forming voltage, and the effect of reducing the reset current.

In the nonvolatile memory device D102, a clear boundary does not need to exist between the resistance change layer 111 and the lateral layer 113. That is, in the resistance change layer, the content of the element whose "standard free energy of oxide formation" has a relatively small absolute value (the element except oxygen) may be higher on the lateral side than in the center portion in the plane (X-Y plane) perpendicular to the stacking direction (Z-axis direction). For instance, the center portion of the resistance change layer may be substantially made of an oxide of Ti, in which from the center portion toward the lateral surface, the content of Ti decreases, whereas the content of Si conversely increases. Thus, the lateral layer can also be regarded as a portion on the lateral side of the resistance change layer where the concentration of the element whose "standard free energy of oxide formation" has a small absolute value is relatively higher than in the center portion.

Furthermore, the lateral layer 113 does not necessarily need to be provided on the lateral surfaces in all directions of the resistance change layer 111, but only needs to be provided at least part of the lateral surfaces of the resistance change layer 111.

Furthermore, the lateral layer 113 only needs to function as an oxygen supply layer for the resistance change layer 111.

The electrical resistance of the lateral layer 113 may or may not change with at least one of the electric field applied to and the current passed in the lateral layer 113. That is, the lateral layer 113 is arbitrary in the change of its electrical resistance.

Thus, the lateral layer 113 functions as an oxygen supply layer for the resistance change layer 111 and has a higher electrical resistance than the resistance change layer 111.

Figure 7:
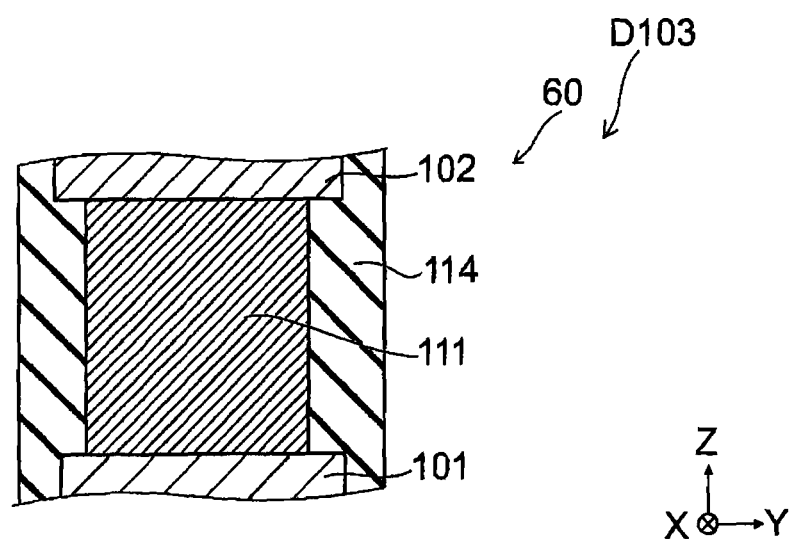
FIG. 7 is a schematic cross-sectional view illustrating the configuration of another nonvolatile memory device according to the second embodiment.

FIG. 7 is a schematic cross-sectional view illustrating the configuration of another nonvolatile memory device according to the second embodiment of the invention.

As shown in FIG. 7, in a nonvolatile memory device D103 of a variation according to this embodiment, part of a lateral layer 114 is provided between the first conductive layer 101 and the second conductive layer 102. Furthermore, another part of the lateral layer 114 is opposed to the lateral surface of the first conductive layer 101 and the lateral surface of the second conductive layer 102.

Thus, the lateral layer 114 only needs to be provided on the lateral surface of the resistance change layer 111. For instance, at least part of the lateral layer 114 may be provided between the first conductive layer 101 and the second conductive layer 102.

Like the aforementioned lateral layer 113, the lateral layer 114 is a layer including an oxide of an element whose "standard free energy of oxide formation" has a smaller absolute value than that of the element except oxygen contained in the oxide included in the resistance change layer 111. Thus, the nonvolatile memory device D103 has an effect similar to that of the nonvolatile memory device D102.

As described earlier, also in the nonvolatile memory device D101 according to the first embodiment, like the lateral layer 114 illustrated in FIG. 7, part of the lateral layer 112 may be opposed to at least part of the lateral surface of the first conductive layer 101 and the lateral surface of the second conductive layer 102. Furthermore, at least part of the lateral layer 112 may be provided between the first conductive layer 101 and the second conductive layer 102. Also in this case, an effect similar to that of the nonvolatile memory device D101 is achieved.

Third Embodiment

Figure 8A:
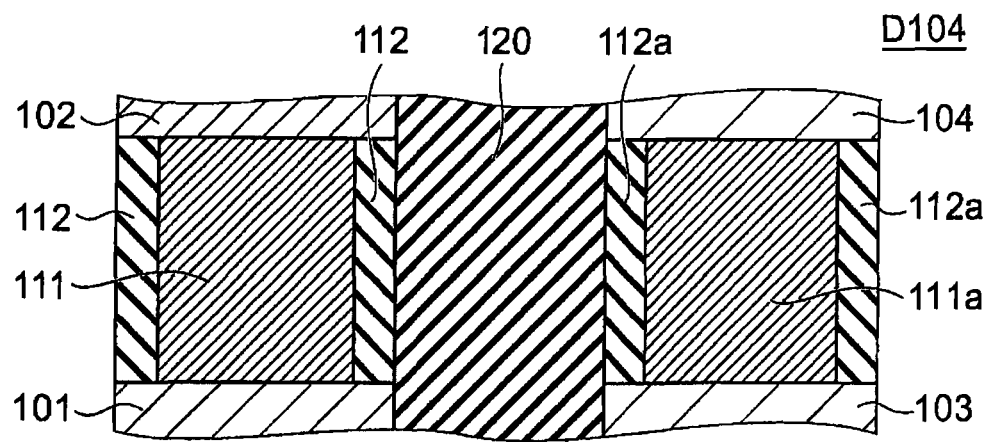
FIGS. 8A to 8C are schematic cross-sectional views illustrating the configurations of nonvolatile memory devices according to a third embodiment.
Figure 8B:
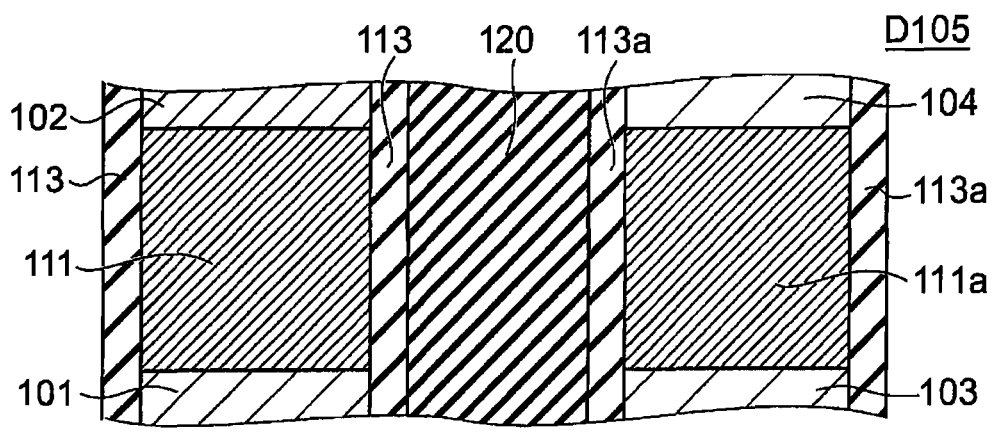
Figure 8C:
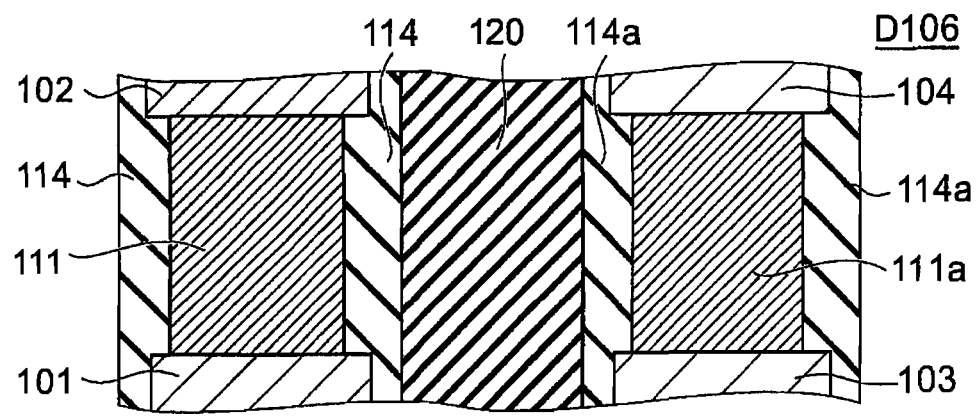

FIGS. 8A to 8C are schematic cross-sectional views illustrating the configurations of nonvolatile memory devices according to a third embodiment of the invention.

As shown in FIG. 8A, a nonvolatile memory device D104 according to this embodiment includes a first conductive layer 101, a second conductive layer 102, a first resistance change layer 111 provided between the first conductive layer 101 and the second conductive layer 102 and having an electrical resistance changing with at least one of the electric field applied thereto and the current passed therein, and a first lateral layer 112 provided on the lateral surface of the first resistance change layer 111 and having a higher oxygen concentration than the first resistance change layer 111.

The nonvolatile memory device D104 further includes a third conductive layer 103 opposed to the lateral surface of the first conductive layer 101, a fourth conductive layer 104 opposed to the lateral surface of the second conductive layer 102, a second resistance change layer 111a provided between the third conductive layer 103 and the fourth conductive layer 104 and having an electrical resistance changing with at least one of the electric field applied thereto and the current passed therein, a second lateral layer 112a provided on the lateral surface of the second resistance change layer 111a on the first lateral layer 112 side, and an interlayer insulating film 120 provided between the first lateral layer 112 and the second lateral layer 112a.

The second lateral layer 112a is made of a compound having a higher oxygen concentration than the second resistance change layer 111a. For instance, the second resistance change layer 111a can be made of a material similar to that of the first resistance change layer 111, and the second lateral layer 112a can be made of a material similar to that of the first lateral layer 112.

More specifically, for instance, the first and second resistance change layers 111 and 111a can be made of an oxide of a transition metal, and the first and second lateral layers 112 and 112a can be made of an oxide of the transition metal included in the first and second resistance change layers 111 and 111a and having a higher oxygen concentration than the first and second resistance change layers 111 and 111a.

The interlayer insulating film 120 can be made of a compound having a higher oxygen concentration than the first lateral layer 112 and the second lateral layer 112a.

More specifically, in this case, the interlayer insulating film 120 has a higher oxygen concentration than the first and second resistance change layers 111 and 111a and also has a higher oxygen concentration than the first and second lateral layers 112 and 112a. This allows oxygen contained in the first and second lateral layers 112 and 112a to easily migrate toward the first and second resistance change layers 111 and 111a rather than toward the interlayer insulating film 120. This further enhances the capacity for oxygen supply of the first lateral layer 112 and the second lateral layer 112a to the first resistance change layer 111 and the second resistance change layer 111a.

Alternatively, the interlayer insulating film 120 may have a lower oxygen concentration than the first and second lateral layers 112 and 112a. For instance, the oxygen concentration in the interlayer insulating film 120 can be optimized from the viewpoint of insulation performance of the interlayer insulating film 120. Here, even if the oxygen concentration in the interlayer insulating film 120 is lower than that in the first and second lateral layers 112 and 112a, the oxygen concentration in the first and second lateral layers 112 and 112a is higher than that in the first and second resistance change layers 111 and 111a. This allows oxygen in the first and second lateral layers 112 and 112a to easily migrate toward the first and second resistance change layers 111 and 111a. That is, while imparting high insulation performance to the interlayer insulating film 120, it is possible to provide the first and second lateral layers 112 and 112a functioning as oxygen supply layers.

Furthermore, in the nonvolatile memory device D104, the interlayer insulating film 120 can illustratively include an oxide of an element whose "standard free energy of oxide formation" has a smaller absolute value than that of the element except oxygen in the oxide included in the first lateral layer 112 and the second lateral layer 112a. This allows oxygen contained in the first and second lateral layers 112 and 112a to easily migrate toward the first and second resistance change layers 111 and 111a rather than toward the interlayer insulating film 120.

As shown in FIG. 8B, a nonvolatile memory device D105 according to this embodiment includes a first conductive layer 101, a second conductive layer 102, a first resistance change layer 111, and a first lateral layer 113 provided on the lateral surface of the first resistance change layer 111 and including an oxide of an element whose "standard free energy of oxide formation" has a smaller absolute value than that of the element except oxygen in the oxide included in the first resistance change layer 111.

The nonvolatile memory device D105 further includes a third conductive layer 103, a fourth conductive layer 104, a second resistance change layer 111a, a second lateral layer 113a provided on the lateral surface of the second resistance change layer 111a on the first lateral layer 113 side, and an interlayer insulating film 120 provided between the first lateral layer 113 and the second lateral layer 113a.

The second lateral layer 113a includes an oxide of an element whose "standard free energy of oxide formation" has a smaller absolute value than that of the element except oxygen in the oxide included in the second resistance change layer 111a.

Furthermore, the interlayer insulating film 120 can include an oxide of an element whose "standard free energy of oxide formation" has a smaller absolute value than that of the element except oxygen in the oxide included in the first lateral layer 113 and the second lateral layer 113a.

That is, the nonvolatile memory device D105 is made of oxides of an element with the absolute value of the "standard free energy of oxide formation" decreasing in the order of the first and second resistance change layers 111 and 111a, the first and second lateral layers 113 and 113a, and the interlayer insulating film 120.

This allows oxygen contained in the first and second lateral layers 113 and 113a to easily migrate toward the first and second resistance change layers 111 and 111a rather than toward the interlayer insulating film 120.

Furthermore, in the nonvolatile memory device D105, the interlayer insulating film 120 can be made of a compound having a lower oxygen concentration than the first lateral layer 113 and the second lateral layer 113a.

More specifically, for instance, the first and second resistance change layers 111 and 111a can be made of an oxide of Ti, the first and second lateral layers 113 and 113a can be made of a compound of Si ($SiO_{2+\delta}$, where $\delta$ is positive) having a relatively high oxygen concentration, and the interlayer insulating film 120 can be made of a compound of Si ($SiO_2$) having a relatively low oxygen concentration. Hence, while maintaining high insulation performance in the interlayer insulating film 120, it is possible to relatively increase the oxygen concentration in the first and second lateral layers 113 and 113a. This allows oxygen contained in the first and second lateral layers 113 and 113a to easily migrate toward the first and second resistance change layers 111 and 111a. This facilitates forming of the first and second resistance change layers 111 and 111a, improves the efficiency of forming by reducing the forming voltage or omitting the forming process, and can reduce the reset current.

As shown in FIG. 8C, in a nonvolatile memory device D106 according to this embodiment, a first lateral layer 114 and a second lateral layer 114a are opposed to the lateral surfaces of a first conductive layer 101 and a second conductive layer 102 and the lateral surfaces of a third conductive layer 103 and a fourth conductive layer 104, respectively. Part of the first lateral layer 114 and part of the second lateral layer 114a are sandwiched between the first conductive layer 101 and the second conductive layer 102 and between the third conductive layer 103 and the fourth conductive layer 104, respectively. The first lateral layer 114 and the second lateral layer 114a can each be based on at least one of the configuration of the first lateral layer 112 and the second lateral layer 112a and the configuration of the first lateral layer 113 and the second lateral layer 113a described above.

In the embodiments of the invention, the lateral layer 112 (first lateral layer 112 and second lateral layer 112a) having a higher oxygen concentration than the resistance change layer 111 (first resistance change layer 111 and second resistance change layer 111a) may be provided simultaneously with the lateral layer 113 (first lateral layer 113 and second lateral layer 113a) including an oxide having a lower free energy of formation than the resistance change layer 111 (first resistance change layer 111 and second resistance change layer 111a).

Fourth Embodiment

In a fourth embodiment of the invention, in addition to at least one of the lateral layer 112 and the lateral layer 113 described above, at least one of a layer having a higher oxygen concentration than the resistance change layer 111 and a layer including an oxide having a lower free energy of formation than the resistance change layer 111 is further provided between the resistance change layer 111 and at least one of the first conductive layer 101 and the second conductive layer 102.

FIGS. 9A to 9F are schematic cross-sectional views illustrating the configurations of nonvolatile memory devices according to the fourth embodiment of the invention.

Figure 9A:
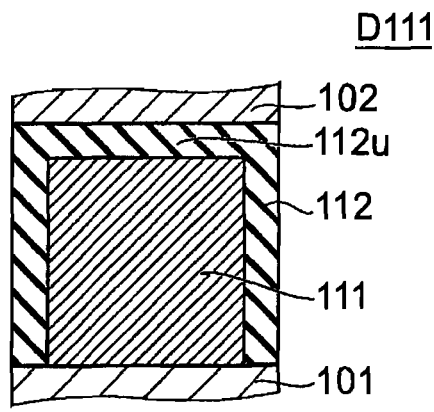
FIGS. 9A to 9F are schematic cross-sectional views illustrating the configurations of nonvolatile memory devices according to a fourth embodiment.

As shown in FIG. 9A, in a nonvolatile memory device D111 according to this embodiment, in addition to a lateral layer 112, a layer 112u having a higher oxygen concentration than a resistance change layer 111 is further provided between the resistance change layer 111 and a second conductive layer 102 (e.g., anode).

Here, in addition to the lateral layer 112, a layer having a higher oxygen concentration than the resistance change layer 111 may be further provided between the resistance change layer 111 and a first conductive layer 101 (e.g., cathode).

Figure 9B:
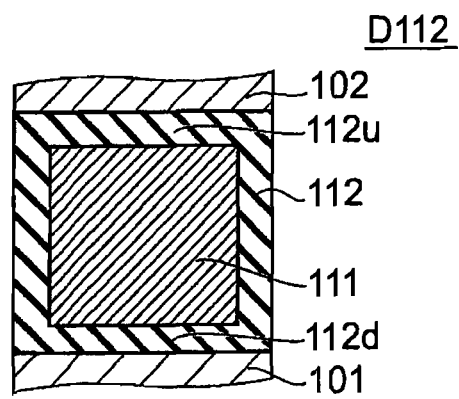

As shown in FIG. 9B, in a nonvolatile memory device D112 according to this embodiment, in addition to a lateral layer 112, layers 112d and 112u having a higher oxygen concentration than a resistance change layer 111 are further provided between the resistance change layer 111 on the one hand and a first conductive layer 101 and a second conductive layer 102 on the other, respectively.

Figure 9C:
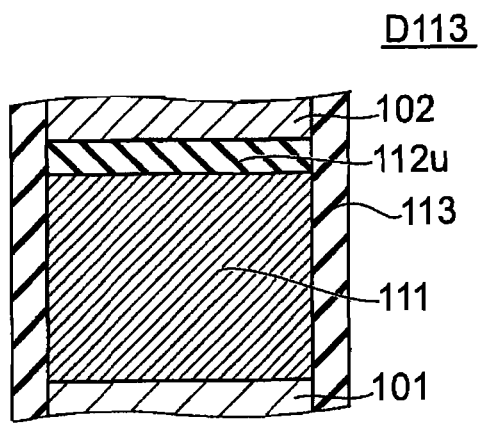

As shown in FIG. 9C, in a nonvolatile memory device D113 according to this embodiment, in addition to a lateral layer 113, a layer 112u having a higher oxygen concentration than a resistance change layer 111 is further provided between the resistance change layer 111 and a second conductive layer 102.

Here, in addition to the lateral layer 113, a layer having a higher oxygen concentration than the resistance change layer 111 may be further provided between the resistance change layer 111 and a first conductive layer 101.

Figure 9D:
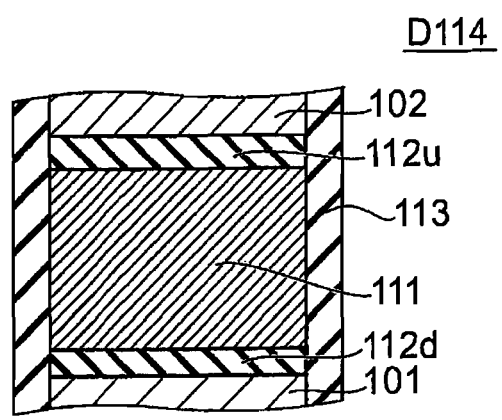

As shown in FIG. 9D, in a nonvolatile memory device D114 according to this embodiment, in addition to a lateral layer 113, layers 112d and 112u having a higher oxygen concentration than a resistance change layer 111 are further provided between the resistance change layer 111 on the one hand and a first conductive layer 101 and a second conductive layer 102 on the other, respectively.

Figure 9E:
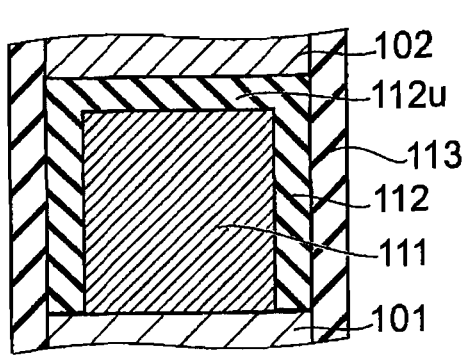

As shown in FIG. 9E, in a nonvolatile memory device D115 according to this embodiment, in addition to a lateral layer 112, a layer 112u having a higher oxygen concentration than a resistance change layer 111 is provided between the resistance change layer 111 and a second conductive layer 102. Furthermore, a lateral layer 113 including an oxide having a lower free energy of formation than the resistance change layer 111 is provided on the lateral surface of the lateral layer 112. Here, in addition to the lateral layer 112, a layer having a higher oxygen concentration than the resistance change layer 111 may be provided between the resistance change layer 111 and a first conductive layer 101, and the lateral layer 113 may be further provided on the lateral surface of the lateral layer 112.

Figure 9F:
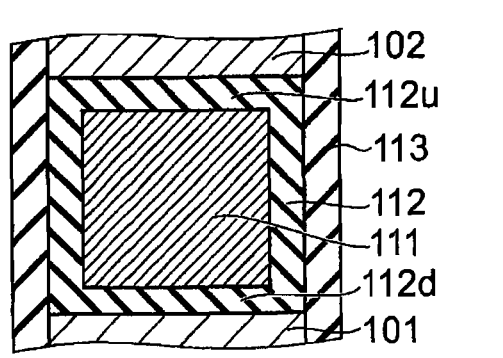

As shown in FIG. 9F, in a nonvolatile memory device D116 according to this embodiment, in addition to a lateral layer 112, layers 112d and 112u having a higher oxygen concentration than a resistance change layer 111 are further provided between the resistance change layer 111 on the one hand and a first conductive layer 101 and a second conductive layer 102 on the other, respectively. Furthermore, a lateral layer 113 including an oxide having a lower free energy of formation than the resistance change layer 111 is provided on the lateral surface of the lateral layer 112.

FIGS. 10A to 10F are schematic cross-sectional views illustrating the configurations of other nonvolatile memory devices according to the fourth embodiment of the invention.

Figure 10A:
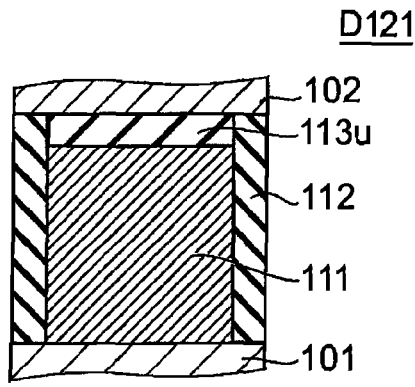
FIGS. 10A to 10F are schematic cross-sectional views illustrating the configurations of other nonvolatile memory devices according to the fourth embodiment.

As shown in FIG. 10A, in a nonvolatile memory device D121 according to this embodiment, in addition to a lateral layer 112, a layer 113u including an oxide having a lower free energy of formation than a resistance change layer 111 is further provided between the resistance change layer 111 and a second conductive layer 102 (e.g., anode).

Here, in addition to the lateral layer 112, a layer including an oxide having a lower free energy of formation than the resistance change layer 111 may be further provided between the resistance change layer 111 and a first conductive layer 101 (e.g., cathode).

Figure 10B:
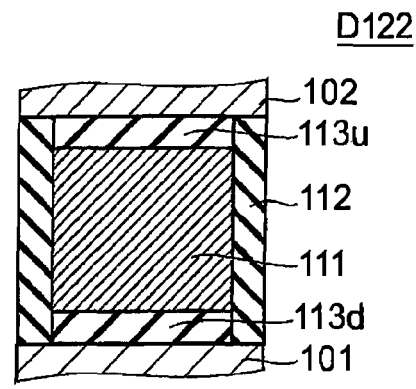

As shown in FIG. 10B, in a nonvolatile memory device D122 according to this embodiment, in addition to a lateral layer 112, layers 113d and 113u including an oxide having a lower free energy of formation than the resistance change layer 111 are further provided between a resistance change layer 111 on the one hand and a first conductive layer 101 and a second conductive layer 102 on the other, respectively.

Figure 10C:
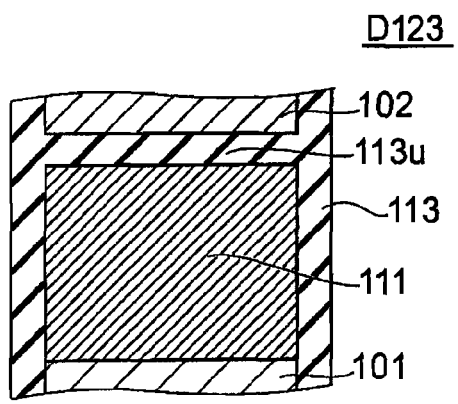

As shown in FIG. 10C, in a nonvolatile memory device D123 according to this embodiment, in addition to a lateral layer 113, a layer 113u including an oxide having a lower free energy of formation than a resistance change layer 111 is further provided between the resistance change layer 111 and a second conductive layer 102.

Here, in addition to the lateral layer 113, a layer including an oxide having a lower free energy of formation than the resistance change layer 111 may be further provided between the resistance change layer 111 and a first conductive layer 101.

Figure 10D:
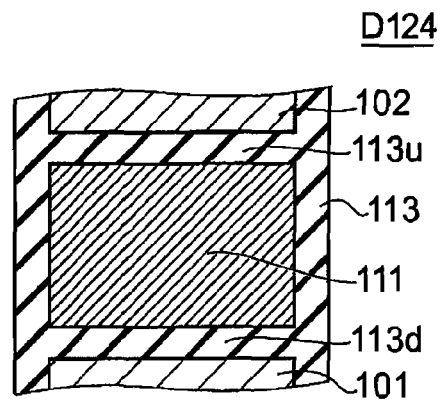

As shown in FIG. 10D, in a nonvolatile memory device D124 according to this embodiment, in addition to a lateral layer 113, layers 113d and 113u including an oxide having a lower free energy of formation than a resistance change layer 111 are further provided between the resistance change layer 111 on the one hand and a first conductive layer 101 and a second conductive layer 102 on the other, respectively.

Figure 10E:
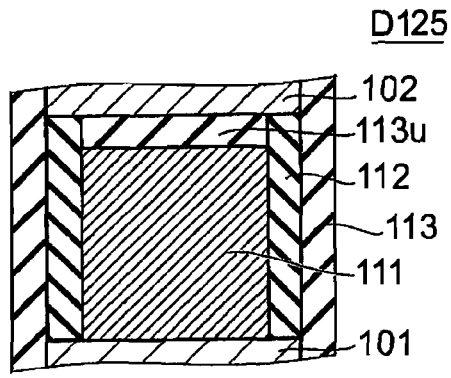

As shown in FIG. 10E, in a nonvolatile memory device D125 according to this embodiment, in addition to a lateral layer 112, a layer 113u including an oxide having a lower free energy of formation than a resistance change layer 111 is provided between the resistance change layer 111 and a second conductive layer 102. Furthermore, a lateral layer 113 including an oxide having a lower free energy of formation than the resistance change layer 111 is provided on the lateral surface of the lateral layer 112.

Here, in addition to the lateral layer 112, a layer including an oxide having a lower free energy of formation than the resistance change layer 111 may be provided between the resistance change layer 111 and a first conductive layer 101, and the lateral layer 113 may be further provided on the lateral surface of the lateral layer 112.

Figure 10F:
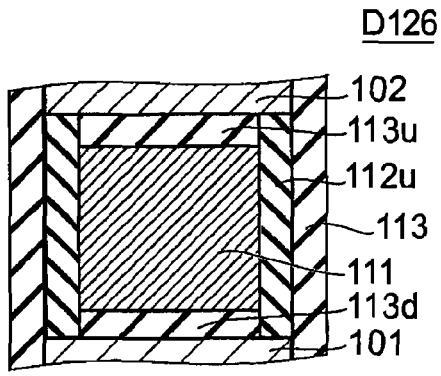

As shown in FIG. 10F, in a nonvolatile memory device D126 according to this embodiment, in addition to a lateral layer 112, layers 113d and 113u including an oxide having a lower free energy of formation than a resistance change layer 111 are further provided between the resistance change layer 111 on the one hand and a first conductive layer 101 and a second conductive layer 102 on the other, respectively. Furthermore, a lateral layer 113 including an oxide having a lower free energy of formation than the resistance change layer 111 is provided on the lateral surface of the lateral layer 112.

Thus, various modifications are applicable to the nonvolatile memory device according to this embodiment. Also in these nonvolatile memory devices, the forming voltage can be reduced, the efficiency of forming can be improved, and the reset current can be reduced.

More specifically, in various nonvolatile memory devices according to this embodiment, a layer serving as an oxygen supply layer (lateral layers 112 and 113) is provided on the lateral surface of the resistance change layer 111, and also provided on the surface located in the film thickness direction of the resistance change layer 111. Hence, as described with reference to the first to third embodiments, even for a fine cell, resetting can be easily performed. Furthermore, because the oxygen supply layer is provided also near the anode and cathode, resetting can be performed more easily than in the first to third embodiments. Furthermore, because the resistance change layer 111 having a metal-rich composition is provided in the center portion between the first conductive layer 101 and the second conductive layer 102, the forming voltage can be reduced.

FIGS. 11A to 11E are schematic cross-sectional views in order of the processes, illustrating a method for manufacturing a nonvolatile memory device according to the fourth embodiment of the invention.

More specifically, FIGS. 11A to 11E illustrate a method for manufacturing the nonvolatile memory device D116 illustrated in FIG. 9F.

First, as shown in FIG. 11A, a first conductive film 101f, which serves as a first conductive layer 101, is formed on a substrate 100s. Then, a film 112df, which serves as a layer 112d having an oxygen-rich composition, is formed thereon. For instance, in the case of using the sputtering process, the oxygen flow rate and the oxidation temperature are made higher than in the film formation of the resistance change film 111f (a relatively metal-rich film) described later. In the case of using the ALD or CVD process, film formation is performed by increasing the flow rate and time of the oxidizer and decreasing the flow rate and time of the metal precursor as compared with the film formation of the resistance change film 111f.

Subsequently, a resistance change film 111f, which serves as a resistance change layer 111, is formed. This can be based on the method described with reference to the first embodiment.

Subsequently, by a method similar to that for the film 112df, for instance, a film 112uf, which serves as a layer 112u having an oxygen-rich composition, is formed on the resistance change film 111f.

Then, a second conductive film 102f is formed thereon.

Subsequently, as shown in FIGS. 11B and 11C, for instance, by the method described in the first embodiment, the second conductive film 102f, the film 112uf, the resistance change film 111f, the film 112df, and the first conductive film 101f are processed. Thus, a first conductive layer 101, a layer 112d, a layer 112u, and a second conductive layer 102 are formed, and the resistance change film 111f serving as a resistance change layer 111 is formed therebetween. That is, the lateral surface of the resistance change film 111f is formed.

Then, as shown in FIG. 11D, for instance, by the method described in the first embodiment, the lateral surface of the resistance change film 111f is oxidized to form a lateral layer 112. Simultaneously, the damage caused to the lateral surface of the cell in the etching process is repaired.

Then, as shown in FIG. 11E, for instance, by the method described with respect to the second embodiment, a silicon oxide film, for instance, which serves as a lateral layer 113 functioning as an oxygen supply layer is formed. Then, the silicon oxide film on the second conductive layer 102 is removed as necessary, and an interlayer insulating film is formed.

Thus, the nonvolatile memory device D116 can be fabricated.

It is noted that various nonvolatile memory devices and the variations thereof illustrated in FIGS. 9A to 9E and FIGS. 10A to 10F can also be fabricated by using methods similar to the foregoing, suitably modified if necessary.

Fifth Embodiment

FIGS. 12A to 12F are schematic cross-sectional views illustrating the configurations of nonvolatile memory devices according to a fifth embodiment of the invention.

Figure 12A:
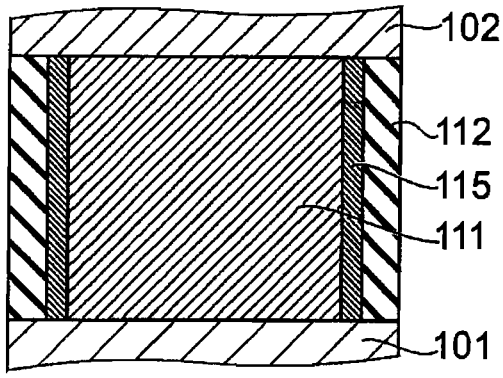
FIGS. 12A to 12F are schematic cross-sectional views illustrating the configurations of nonvolatile memory devices according to a fifth embodiment.

As shown in FIG. 12A, a nonvolatile memory device D131 according to this embodiment further includes a diffusion barrier layer 115 provided between a resistance change layer 111 and a lateral layer 112. The lateral layer 112 is a layer having a higher oxygen concentration than the resistance change layer 111. In the following, for simplicity, the "layer having a higher oxygen concentration than the resistance change layer" is simply referred to as the "layer having high oxygen concentration".

Figure 12B:
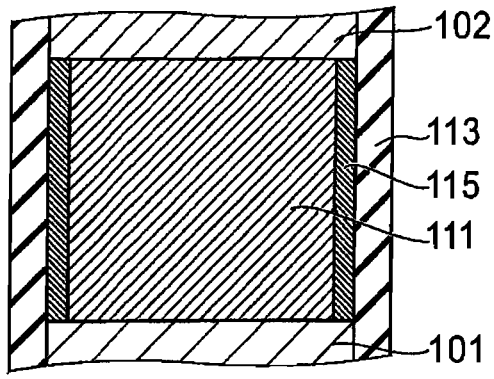

As shown in FIG. 12B, another nonvolatile memory device D132 according to this embodiment further includes a diffusion barrier layer 115 provided between a resistance change layer 111 and a lateral layer 113 (the layer including an oxide having a lower free energy of formation than the resistance change layer 111).

Figure 12C:
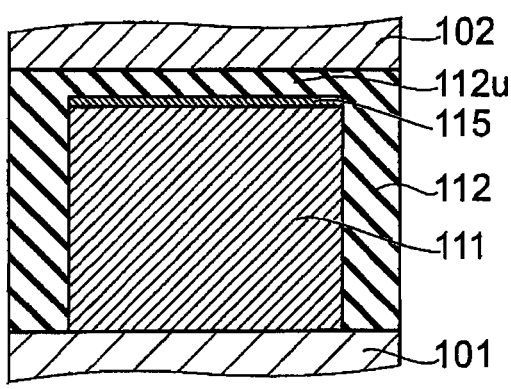

As shown in FIG. 12C, another nonvolatile memory device D133 according to this embodiment further includes, besides a lateral layer 112, a layer 112u having high oxygen concentration provided between a resistance change layer 111 and a second conductive layer 102, and a diffusion barrier layer 115 provided between the resistance change layer 111 and the layer 112u.

Here, besides the lateral layer 112, a layer 112d having high oxygen concentration may be provided between the resistance change layer 111 and a first conductive layer 101, and the diffusion barrier layer 115 may be further provided between the resistance change layer 111 and the layer 112d.

Figure 12D:
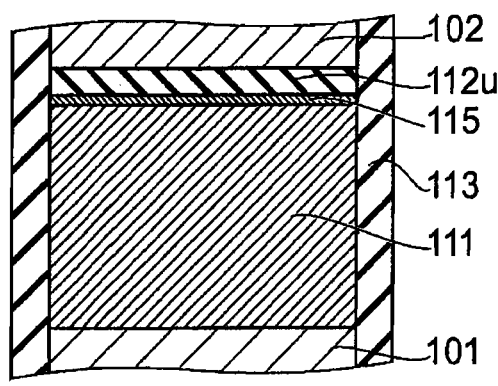

As shown in FIG. 12D, a nonvolatile memory device D134 according to this embodiment further includes, besides a lateral layer 113, a layer 112u having high oxygen concentration provided between a resistance change layer 111 and a second conductive layer 102, and a diffusion barrier layer 115 provided between the resistance change layer 111 and the layer 112u.

Here, besides the lateral layer 113, a layer 112d having high oxygen concentration may be provided between the resistance change layer 111 and a first conductive layer 101, and the diffusion barrier layer 115 may be further provided between the resistance change layer 111 and the layer 112d.

Figure 12E:
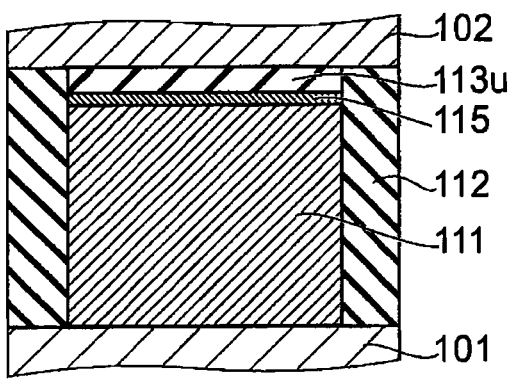

As shown in FIG. 12E, a nonvolatile memory device D135 according to this embodiment further includes, besides a lateral layer 112, a layer 113u provided between a resistance change layer 111 and a second conductive layer 102 and including an oxide having a lower free energy of formation than the resistance change layer 111, and a diffusion barrier layer 115 provided between the resistance change layer 111 and the layer 113u.

Here, besides the lateral layer 112, a layer 113d including an oxide having a lower free energy of formation than the resistance change layer 111 may be provided between the resistance change layer 111 and a first conductive layer 101, and the diffusion barrier layer 115 may be further provided between the resistance change layer 111 and the layer 113d.

Figure 12F:
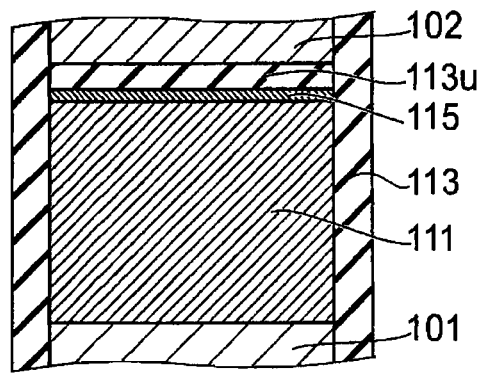

As shown in FIG. 12F, a nonvolatile memory device D136 according to this embodiment further includes, besides a lateral layer 113, a layer 113u provided between a resistance change layer 111 and a second conductive layer 102 and including an oxide having a lower free energy of formation than the resistance change layer 111, and a diffusion barrier layer 115 provided between the resistance change layer 111 and the layer 113u.

Here, besides the lateral layer 113, a layer 113d including an oxide having a lower free energy of formation than the resistance change layer 111 may be provided between the resistance change layer 111 and a first conductive layer 101, and the diffusion barrier layer 115 may be further provided between the resistance change layer 111 and the layer 113d.

The diffusion barrier layer 115 illustrated in FIGS. 12A and 12B has the effect of suppressing migration of metallic elements in at least one of between the resistance change layer 111 and the lateral layer 112 and between the resistance change layer 111 and the lateral layer 113.

The diffusion barrier layer 115 illustrated in FIGS. 12C to 12F has the effect of suppressing migration of metallic elements in at least one of between the resistance change layer 111 and at least one of the layers 112u and 112d and between the resistance change layer 111 and at least one of the layers 113u and 113d.

That is, the diffusion barrier layer 115 is a layer in which the element except oxygen contained in the resistance change layer 111 migrates less easily than in the resistance change layer 111.

The diffusion barrier layer 115 can suppress diffusion of metals by heat applied to the resistance change film 111f (resistance change layer 111) in various processes for manufacturing the nonvolatile memory device. Thus, a nonvolatile memory device further fitted to desired characteristics can be fabricated.

The diffusion barrier layer 115 can illustratively be made of silicon nitride film, silicon oxide film, and nitrides obtained by, for instance, nitridizing the metal oxide included in the resistance change layer 111. For instance, in the case where the resistance change layer 111 is made of $HfO_2$, the diffusion barrier layer 115 can be made of a material ($HfN_x$ and HfON) obtained by nitridizing $HfO_2$. Then, the diffusion constant of Hf in the diffusion barrier layer 115 ($HfN_x$ and HfON) is smaller than ease of migration of Hf in the resistance change layer 111 ($HfO_2$). This can suppress diffusion of Hf between the resistance change layer 111 and various layers opposed thereto (lateral layers 112 and 113, and layers 112u, 112d, 113u, and 113d), achieving stable characteristics.

It is noted that thermal stress in the process for manufacturing the nonvolatile memory device is e.g. approximately 750 to 800° C. or less. The diffusion barrier layer 115 can be designed to suppress diffusion of metals under this condition.

It is noted that during operation of the completed nonvolatile memory device, the resistance change layer 111 is heated by, for instance, at least one of the electric field applied thereto and the current passed therein. However, this heating is more local than heating in the manufacturing process, and its time is shorter. The diffusion barrier layer 115 is designed so as to substantially avoid disturbing the migration of oxygen between the resistance change layer 111 and at least one of the lateral layer 112 and the lateral layer 113 while also suppressing diffusion of metals at the temperature during this operation. Furthermore, in the case where the layers 112u, 112d, 113u, and 113d are provided, the diffusion barrier layer 115 is designed so as to substantially avoid disturbing the migration of oxygen between the resistance change layer 111 and these layers while also suppressing diffusion of metals at the temperature during this operation.

The configurations illustrated in FIGS. 12A to 12F are some of the example configurations of the diffusion barrier layer 115, and various modifications are applicable to the layout of the diffusion barrier layer 115.

More specifically, the diffusion barrier layer 115 in which the element except oxygen contained in the resistance change layer 111 has a lower diffusion constant than in the resistance change layer 111 can be provided in at least one of at least in part between the resistance change layer 111 and the lateral layer 112, and at least in part between the resistance change layer 111 and the lateral layer 113.

Furthermore, in the case where the layer 112d having a higher oxygen concentration than the resistance change layer 111 is provided between the resistance change layer 111 and the first conductive layer 101, the aforementioned diffusion barrier layer 115 can be provided at least in part between the resistance change layer 111 and the layer 112d. Here, in the case where the layer 112u having a higher oxygen concentration than the resistance change layer 111 is further provided between the resistance change layer 111 and the second conductive layer 102, the aforementioned diffusion barrier layer 115 can be provided in at least part of at least in part between the resistance change layer 111 and the layer 112d and at least in part between the resistance change layer 111 and the layer 112u.

Furthermore, in the case where the layer 113d including an oxide having a lower free energy of formation than the resistance change layer 111 is provided between the resistance change layer 111 and the first conductive layer 101, the aforementioned diffusion barrier layer 115 can be provided at least in part between the resistance change layer 111 and the layer 113d. Here, in the case where the layer 113u including an oxide having a lower free energy of formation than the resistance change layer 111 is further provided between the resistance change layer 111 and the second conductive layer 102, the aforementioned diffusion barrier layer 115 can be provided in at least part of at least in part between the resistance change layer 111 and the layer 113d and at least in part between the resistance change layer 111 and the layer 113u.

FIGS. 13A to 13F are schematic cross-sectional views in order of the processes, illustrating a method for manufacturing another nonvolatile memory device according to the fifth embodiment of the invention.

First, as shown in FIG. 13A, a first conductive film 101f, which serves as a first conductive layer 101, is formed on a substrate 100s. Then, a film 112df, which serves as a layer 112d having an oxygen-rich composition, is formed thereon.

Subsequently, a film 115df, which serves as a diffusion barrier layer 115d, is formed. For instance, in the case where the diffusion barrier layer 115$d$ is made of silicon oxide film, the film 115$df$ can be formed by the ALD process using 3DMAS and ozone at a temperature of approximately 500° C. Alternatively, the film 115$df$ may be formed by the CVD process using dichlorosilane and nitrous oxide at a high temperature of approximately 700° C. In the case where the diffusion barrier layer 115$d$ is made of silicon nitride film, the film 115$df$ can be formed using dichlorosilane and ammonia by the ALD process at a temperature of approximately 400° C., or by the CVD process at a temperature of approximately 700° C. In the case where the film 115$df$ is formed by nitridizing the film 112$df$, the film 112$df$ may be thermally nitridized using ammonia at a temperature of e.g. approximately 800° C., or may be subjected to plasma nitridation using a nitrogen plasma.

Subsequently, a resistance change film 111$f$, which serves as a resistance change layer 111, is formed. This can be based on the method described with reference to the first embodiment.

Subsequently, a film 115$uf$, which serves as a diffusion barrier layer 115$u$, is formed on the resistance change film 111$f$. The film formation of the film 115$uf$ can illustratively be based on technically applicable methods of those described with reference to the film 115$df$.

Subsequently, by a method similar to that for the film 112$df$, for instance, a film 112$uf$, which serves as a layer 112$u$ having an oxygen-rich composition, is formed.

Then, a second conductive film 102$f$ is formed thereon.

Subsequently, as shown in FIGS. 13B and 13C, for instance, by the method described in the first embodiment, the second conductive film 102$f$, the film 112$uf$, the film 115$uf$, the resistance change film 111$f$, the film 112$df$, the film 115$df$, and the first conductive film 101$f$ are processed to form a first conductive layer 101 and a second conductive layer 102. Then, the lateral surface of the resistance change film 111$f$ is formed.

Then, as shown in FIG. 13D, the lateral portions of the film 112$uf$, the resistance change film 111$f$, and the film 112$df$ are nitridized to form a film 115$sf$ serving as a diffusion barrier layer 115$s$ on the lateral surface of the stacked structure of the film 112$uf$, the resistance change film 111$f$, and the film 112$df$.

Then, as shown in FIG. 13E, the surface (sidewall surface) of the film 115$sf$ is oxidized to form a lateral layer 112 having high oxygen concentration.

Then, as shown in FIG. 13F, a layer 113 including an oxide having a lower free energy of formation than the resistance change layer 111 is formed on the lateral surfaces of the first conductive layer 101, the lateral layer 112, and the second conductive layer 102.

Thus, the nonvolatile memory device D137 illustrated in FIG. 13F can be fabricated.

In the nonvolatile memory device D137, the lateral layer 112 and the lateral layer 113 are provided on the lateral surface of the resistance change layer 111. Thus, the forming voltage can be reduced, the efficiency of forming can be improved, and the reset current can be reduced. Furthermore, the layers 112$d$ and 112$u$ having high oxygen concentration are provided between the resistance change layer 111 on the one hand and the first conductive layer 101 and the second conductive layer 102 on the other, respectively. Hence, the reset operation is further facilitated. Furthermore, the diffusion barrier layer 115$s$ is provided between the resistance change layer 111 and the lateral layer 112, and the diffusion barrier layers 115$d$ and 115$u$ are provided between the resistance change layer 111 on the one hand and the layers 112$d$ and 112$u$ on the other, respectively. This can suppress, for instance, diffusion of the element except oxygen contained in the resistance change layer 111 by application of heat during the manufacturing process, achieving more stable operation.

Sixth Embodiment

Figure 14A:
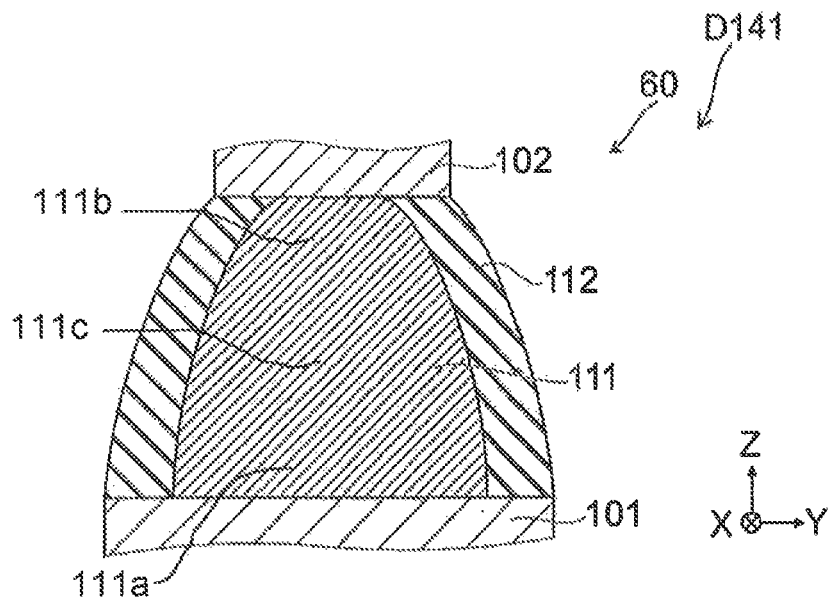
FIGS. 14A and 14B are schematic cross-sectional views illustrating the configurations of nonvolatile memory devices according to a sixth embodiment.
Figure 14B:
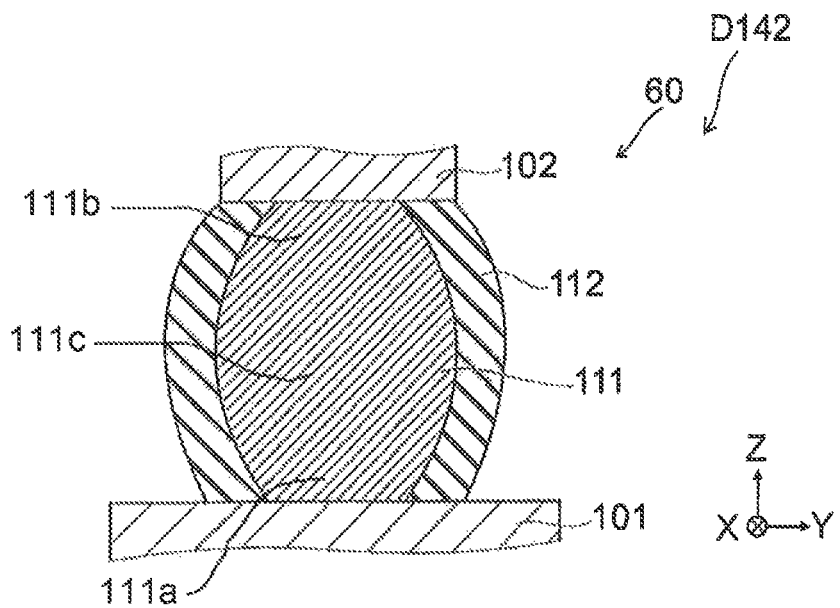

FIGS. 14A and 14B are schematic cross-sectional views illustrating the configurations of nonvolatile memory devices according to a sixth embodiment of the invention.

As shown in FIG. 14A, in a nonvolatile memory device D141 according to this embodiment, the cross section of a resistance change layer 111 cut along a plane (X-Y plane) perpendicular to the Z-axis direction (the stacking direction of a first conductive layer 101, the resistance change layer 111, and a second conductive layer 102) is smaller on the second conductive layer 102 (e.g., anode) side than in the center portion between the first conductive layer 101 and the second conductive layer 102.

That is, the lateral surface of the resistance change layer 111 on the second conductive layer 102 side is set back relative to the center portion.

Thus, at reset time, an electric field is efficiently applied to the resistance change layer 111 near the second conductive layer 102, and oxygen is collected more easily from a lateral layer 112 on the second conductive layer 102 side of the resistance change layer 111, which further facilitates the reset operation.

As shown in FIG. 14B, in a nonvolatile memory device D142 according to this embodiment, the cross section of a resistance change layer 111 cut along the X-Y plane is smaller on the side of a first conductive layer 101 and a second conductive layer 102 than in the center portion between the first conductive layer 101 and the second conductive layer 102.

That is, the lateral surface of the resistance change layer 111 on the side of the first and second conductive layers 101 and 102 is set back relative to the center portion.

In this case, at reset time, in the aforementioned cross section of the resistance change layer 111, a filament 111$p$ is formed more easily in the center portion, but less easily in the end portion of the resistance change layer 111. This can suppress destruction of the cell due to electric field concentration on the end portion of the resistance change layer 111. Furthermore, it is also possible to suppress characteristics variation between cells due to formation of the filament 111$p$ at the end portion.

According to the configurations shown in FIGS. 14A and 14B, the resistance change layer 111 includes a first portion 111$a$, a second portion 111$b$ between the first portion 111$a$ and the second conductive layer 102, and a third portion 111$c$ between the first portion 111$a$ and the second portion 111$b$. Thus, in device D141 (FIG. 14A) and in device D142 (FIG. 14B), a length of the third portion 111$c$ along the Y-direction is longer than a length of the second portion 111$b$ along the Y-direction. Further, in device D141 (FIG. 14A) a length of the first portion 111$a$ along the Y-direction is longer than a length of the third portion 111$c$ along the Y-direction.

It is noted that as described above, in the nonvolatile memory device according to the embodiments of the invention, the first conductive layer 101 and the second conductive layer 102 are interchangeable.

More specifically, in this embodiment, the cross section of the resistance change layer 111 cut along a plane perpendicular to the stacking direction of the first conductive layer 101, the resistance change layer 111, and the second conductive layer 102 is designed to be smaller on at least one side of the first and second conductive layers 101 and 102 than in the center portion between the first conductive layer 101 and the second conductive layer 102.

For instance, the cross section of the resistance change layer 111 (the cross section along the X-Y plane) on the first conductive layer 101 side, rather than on the second conductive layer 102 side, may be smaller than in the center portion.

Here, in the case where the cross section of the resistance change layer 111 is smaller on one side of the first conductive layer 101 and the second conductive layer 102 than in the center portion, it is more preferable that the cross section be smaller on the anode side of the first conductive layer 101 and the second conductive layer 102. This is because the electric field on the side of the anode, where the resistance change layer 111 is oxidized, can be concentrated to efficiently supply oxygen from the lateral layer 112 to this portion of electric field concentration, thereby achieving more efficiently the effect of reducing the forming voltage, improving the efficiency of forming, and reducing the reset current.

In the nonvolatile memory devices D141 and D142, the lateral layer 112 having a higher oxygen concentration than the resistance change layer 111 is illustratively provided on the lateral surface of the resistance change layer 111. However, a lateral layer 113 including an oxide having a lower free energy of formation than the resistance change layer 111 may be provided on the lateral surface of the resistance change layer 111. In this case, as described above, the cross section of the resistance change layer 111 along the X-Y plane may be smaller on one side of the first conductive layer 101 and the second conductive layer 102 than in the center portion.

It is noted that the configuration in which the cross section of the resistance change layer 111 is designed to be smaller on at least one side of the first and second conductive layers 101 and 102 than in the center portion is applicable to any nonvolatile memory device according to the embodiments of the invention described above.

FIGS. 15A to 15D are schematic cross-sectional views in order of the processes, illustrating a method for manufacturing a nonvolatile memory device according to the sixth embodiment of the invention.

More specifically, FIGS. 15A to 15D illustrate a method for manufacturing the nonvolatile memory device D141.

Figures 15A, 15B:
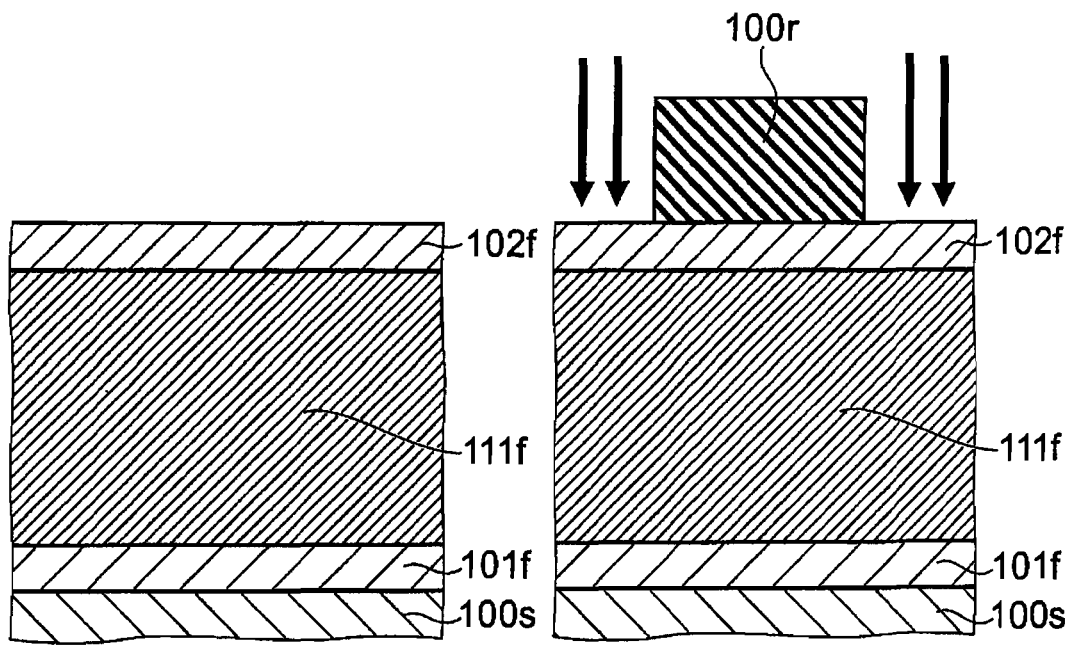
FIGS. 15A to 15D are schematic cross-sectional views in order of the processes, illustrating a method for manufacturing a nonvolatile memory device according to the sixth embodiment.

As shown in FIGS. 15A and 15B, by a method similar to that described with reference to the First embodiment, a first conductive film 101f, a resistance change film 111f, and a second conductive film 102f are formed on a substrate 100s, and a mask 100r is formed on the second conductive film 102f.

Then, the second conductive film 102f, the resistance change film 111f, and the first conductive film 101f are processed illustratively by RIE. Here, for instance, the RIE process is performed with a smaller amount of etching ions than in the condition described with reference to the first embodiment.

Figures 15C, 15D:
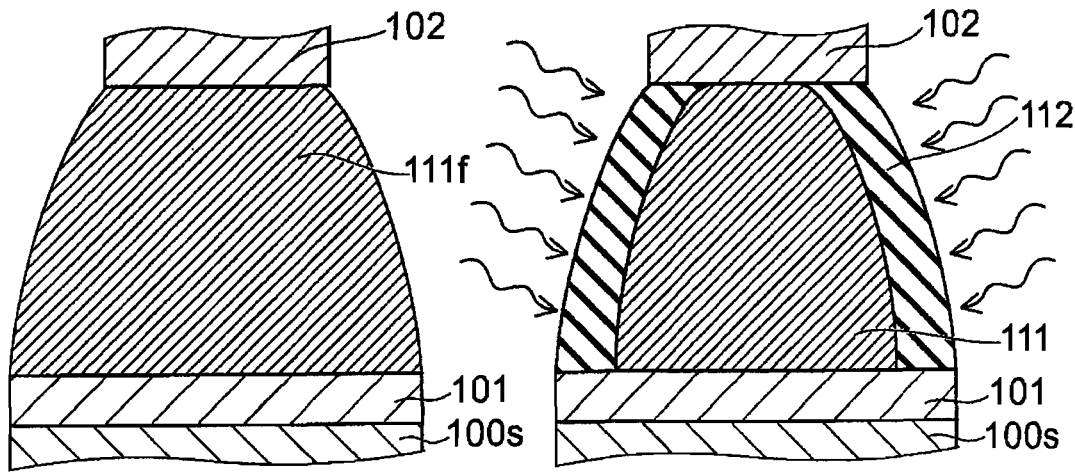

Thus, as shown in FIG. 15C, the lateral surface of the resistance change film 111f is tapered. Consequently, the cross section of the resistance change film 111f is made smaller near a second conductive layer 102 than in the center portion.

Then, as shown in FIG. 15D, the lateral surface of the resistance change film 111f is oxidized by the method described earlier to form a lateral layer 112 having a higher oxygen concentration than a resistance change layer 111 on the lateral surface of the resistance change layer 111.

Thus, the nonvolatile memory device D141 can be fabricated.

Figures 16A, 16B:
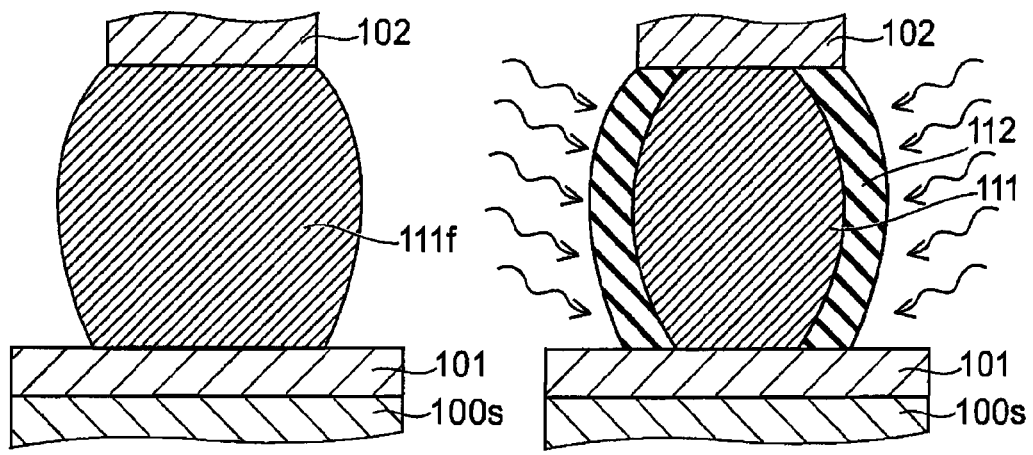
FIGS. 16A and 16B are schematic cross-sectional views in order of the process, illustrating a method for manufacturing another nonvolatile memory device according to the sixth embodiment.

FIGS. 16A and 16B are schematic cross-sectional views in order of the process, illustrating a method for manufacturing another nonvolatile memory device according to the sixth embodiment of the invention.

More specifically, FIGS. 16A and 16B illustrate a method for manufacturing the nonvolatile memory device D142.

For instance, after the processing described in FIGS. 15A to 15C is performed, as shown in FIG. 16A, the resistance change film 111f is wet etched with dilute hydrofluoric acid or the like. By this wet etching, the resistance change film 111f is etched faster on the side of the resistance change film 111f bordering the first conductive layer 101 than in the center portion. Hence, the cross section of the resistance change film 111f is made smaller on the side of the first and second conductive layers 101 and 102 than in the center portion.

Subsequently, as shown in FIG. 16B, the lateral surface of the resistance change film 111f is oxidized by the method described earlier to form a lateral layer 112 having a higher oxygen concentration than the resistance change layer 111 on the lateral surface of the resistance change layer 111.

Thus, the nonvolatile memory device D142 can be fabricated.

Seventh Embodiment

Figure 17A:
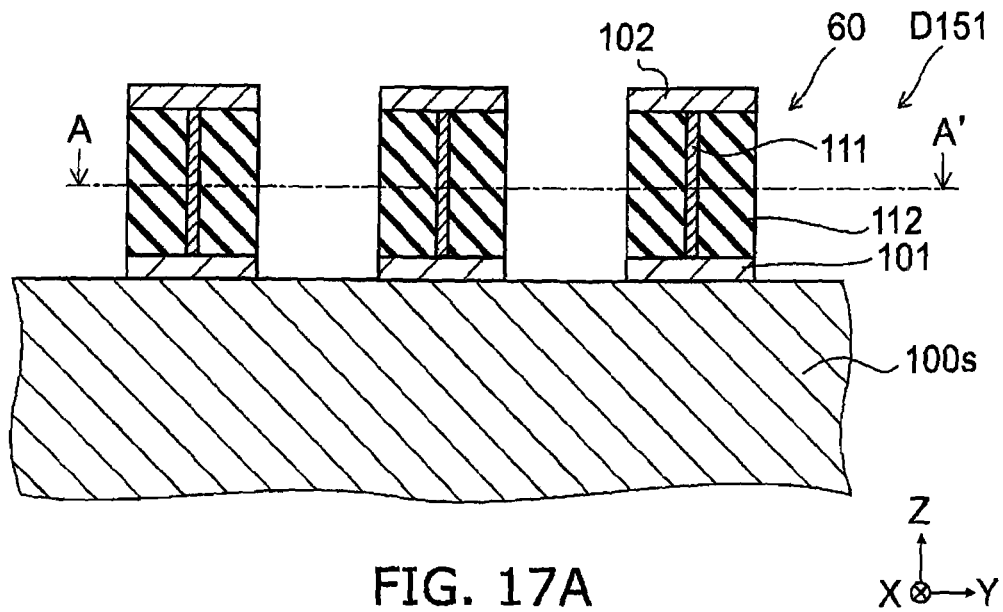
FIGS. 17A and 17B are schematic cross-sectional views illustrating the configuration of a nonvolatile memory device according to a seventh embodiment.
Figure 17B:
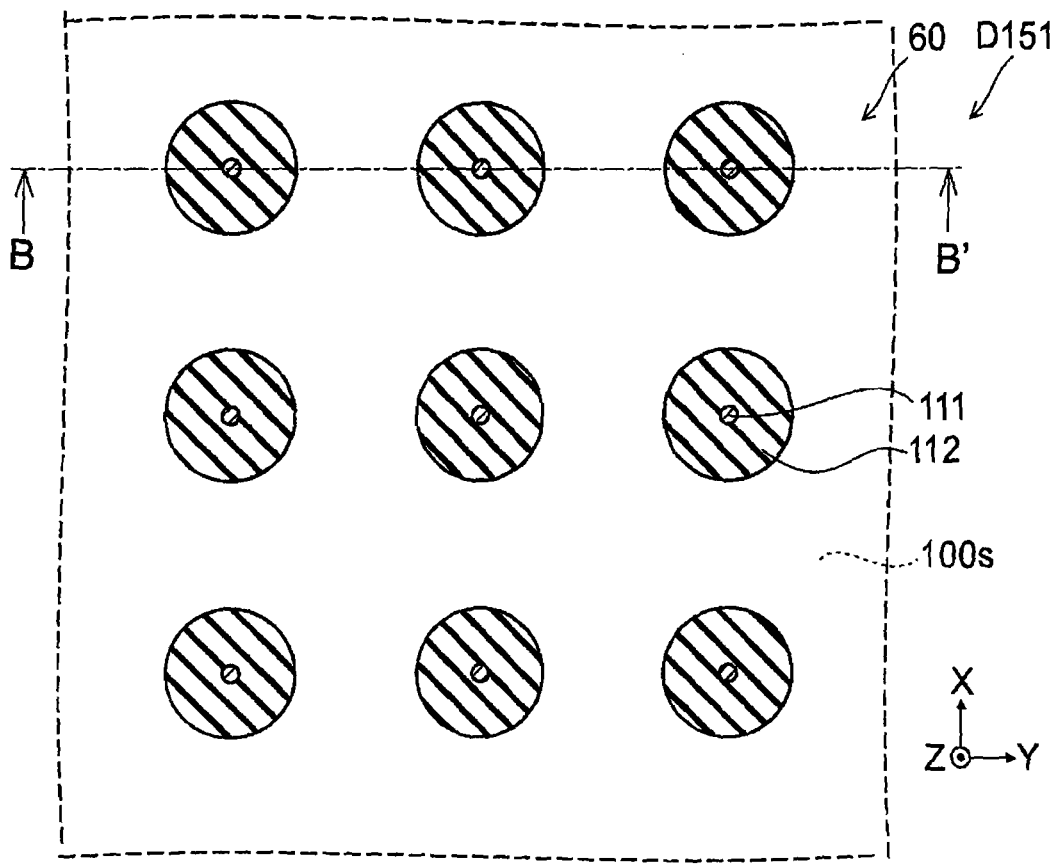

FIGS. 17A and 17B are schematic cross-sectional views illustrating the configuration of a nonvolatile memory device according to a seventh embodiment of the invention.

More specifically, FIG. 17A is a cross-sectional view taken along line B-B' of FIG. 17B, and FIG. 17B shows a cross section taken along line A-A' of FIG. 17A.

As shown in FIGS. 17A and 17B, also in a nonvolatile memory device D151 according to this embodiment, a memory layer 60 includes a first conductive layer 101, a second conductive layer 102, a resistance change layer 111 provided between the first conductive layer 101 and the second conductive layer 102, and a lateral layer 112 provided on the lateral surface of the resistance change layer 111.

The stacking direction of the first conductive layer 101, the resistance change layer 111, and the second conductive layer 102 is referred to as the Z-axis direction. In this example, the memory layer 60 is provided on the major surface of a substrate 100s, and the aforementioned stacking direction (Z-axis direction) is perpendicular to the major surface of the substrate 100s.

The resistance change layer 111 is a layer whose electrical resistance changes with at least one of the electric field applied thereto and the current passed therein. The lateral layer 112 is a layer having a higher oxygen concentration than the resistance change layer 111. The lateral layer 112 functions as an oxygen supply layer for the resistance change layer 111.

More specifically, the resistance change layer 111 and the lateral layer 112 are both made of oxides, and the elements contained in the resistance change layer 111 are substantially the same as the elements contained in the lateral layer 112. However, the content of oxygen in the lateral layer 112 is higher than that in the resistance change layer 111.

The lateral layer 112 has a higher electrical resistance than the resistance change layer 111. For instance, by the method described with reference to FIGS. 4A to 4D, the lateral surface of the film (resistance change film 111f), which serves as the resistance change layer 111 and the lateral layer 112, is oxidized. Thus, the resistance change layer 111 is formed in the center portion of the film, and the lateral layer 112 is formed on the lateral surface of the film.

As shown in FIG. 17B, in this example, the cross-sectional shape of the memory layer 60 (resistance change layer 111 and lateral layer 112) cut along the X-Y plane is circular (including ellipses and other oblate circles). However, as described later, the invention is not limited thereto. The cross-sectional shape of the memory layer 60 is arbitrary.

In the nonvolatile memory device D151, at least one of the composition, electrical resistance, and shape of the resistance change layer 111 and the lateral layer 112 is adjusted so that the resistance change layer 111 functions as a filament 111$p$ described with reference to FIGS. 3A and 3B. Thus, the forming process for forming the filament 111$p$ can be omitted.

More specifically, as described earlier, the filament 111$p$ is formed by the forming process after forming the memory layer 60. However, in the nonvolatile memory device D151, when the memory layer 60 is formed, the resistance change layer 111 being relatively rich in metal and having low electrical resistance is formed in a prescribed shape, and the lateral layer 112 functioning as an oxygen supply layer is provided on the lateral surface thereof. Thus, the resistance change layer 111 functioning as a filament 111$p$ can be formed without the forming process, and the forming process can be omitted.

In the forming process, it is often difficult to control the position and shape of the filament 111$p$ formed in the resistance change layer 111. This causes variation in the formation position and shape of the filament 111$p$, and may result in decreasing the reproducibility of the characteristics of the nonvolatile memory device. For instance, at the time of forming, if a voltage is applied to the resistance change layer 111 to pass a current therein, the flow of current starts to concentrate on the oxygen-deficient portion and the like of the resistance change layer 111. This causes structure change due to Joule heat generation and forms a filament 111$p$, lowering the resistance of the resistance change layer 111. It is relatively difficult to control the density of such defects where the current concentrates. If the density of defects is low, numerous resistance change regions with fine size are generated, failing to achieve desired characteristics. Furthermore, if there is variation in the size and the like of the filament 111$p$ where the resistance is lowered by current concentration, then the resistance is significantly varied, which causes variation in voltage and current at set and reset time and makes it impossible to appropriately establish the read voltage for reading the written data. Moreover, the resistance change layer 111 may be destroyed, with the path between the first and second conductive layers 101 and 102 continuously turned into the conducting state, and fail to function as a resistance change layer 111.

In contrast, in the nonvolatile memory device D151, the filament 111$p$ is not formed by the forming process, but formed from the resistance change layer 111 itself. Thus, the function of the filament 111$p$ can be imparted to the resistance change layer 111. Furthermore, because of high controllability in the formation position and shape of the resistance change layer 111, high reproducibility is achieved in the characteristics of the nonvolatile memory device D151.

That is, the nonvolatile memory device D151 does not need the forming process. Furthermore, the electrical resistance of the resistance change layer 111 can be suitably adjusted beforehand to reduce the reset current to less than the allowable current of the driving circuits, protection diodes and the like. Thus, in the nonvolatile memory device D151, forming can be omitted, and the reset current can be reduced.

Furthermore, because of the small variation of resistance change in the resistance change layer 111, variation in voltage and current at set and reset time can be suppressed, and the controllability in characteristics can be improved. Thus, a nonvolatile memory device with high performance can be realized.

In the nonvolatile memory device D151 thus configured, for instance, the resistance change layer 111 can be narrowly designed so that the resistance change layer 111 has a smaller cross-sectional area than the lateral layer 112. More specifically, the ratio of the cross-sectional area of the resistance change layer 111 cut along the X-Y plane perpendicular to the Z axis versus the cross-sectional area of the lateral layer 112 can be designed to be lower than that in the nonvolatile memory device D101 illustrated in FIG. 1. For instance, the length of the resistance change layer 111 in the cross-sectional direction (perpendicular to the Z-axis direction, or the stacking direction) is shorter than the length of the lateral layer 112 in the cross-sectional direction. However, such shape relationship between the resistance change layer 111 and the lateral layer 112 is illustrative only, and the invention is not limited thereto. The shape relationship between the resistance change layer 111 and the lateral layer 112 is arbitrary.

In the nonvolatile memory device D151, the oxygen concentration in the oxide of the resistance change layer 111 is decreased to reduce its electrical resistance. Hence, the resistance change layer 111 is initially in the low-resistance state LRS or the high-resistance state HRS, and does not need the forming process. That is, without the forming process, the resistance change layer 111 assumes the condition of including the low-resistance state LRS and the high-resistance state HRS as illustrated in FIG. 2, for instance.

Then, for instance, if an electric field (a voltage) is applied between the first and second conductive layer 101 and 102 in the low-resistance state LRS, the flow of current concentrates on the resistance change layer 111 in the low-resistance state LRS. This current generates Joule heat in the resistance change layer 111, increasing the temperature of the resistance change layer 111. When the temperature of the resistance change layer 111 exceeds a certain temperature T1, oxygen migrates from the lateral layer 112, advances the oxidation reaction of the resistance change layer 111, and increases the oxygen concentration in the resistance change layer 111. This increases electrical resistance in the resistance change layer 111, which is turned into the high-resistance state HRS.

Such oxidation reaction is likely to occur near the anode, which receives electrons.

Here, when oxygen migrates from the lateral layer 112 to the resistance change layer 111, the electrical resistance of the resistance change layer 111 increases. However, simultaneously, the oxygen concentration in the lateral layer 112 decreases, and the electrical resistance of the lateral layer 112 tends to decrease. The volume and oxygen concentration of the lateral layer 112 are adjusted beforehand so that the electrical resistance of the lateral layer 112 is kept higher than the increased electrical resistance of the resistance change layer 111 when oxygen is supplied from the lateral layer 112 to the resistance change layer 111.

By such adjustment, when an electric field (a voltage) is applied again between the first and second conductive layers 101 and 102, the flow of current concentrates on the resistance change layer 111 in the high-resistance state HRS. Because the resistance change layer 111 is in the high-resistance state HRS, Joule heat is easily generated even for a small current flowing therein. Then, the current is passed until the temperature reaches a temperature T2 higher than the temperature T1. This temperature T2 is a temperature allowing the progress of reduction reaction in which oxygen in the resistance change layer 111 migrates to the lateral layer 112. Even when the resistance change layer 111 generating heat reaches the temperature T2, the temperature of the lateral layer 112, resistant to current flow, is lower than the temperature T2, although it increases due to heat conduction from the resistance change layer 111. Consequently, oxygen migrates from the resistance change layer 111 to the lateral layer 112, the oxygen concentration in the resistance change layer 111 decreases to that in the initial state, and the resistance change layer 111 returns to the low-resistance state LRS. That is, the set operation is performed. It is noted that as mentioned earlier, the set operation may be performed by an electric field applied to the resistance change layer 111.

Thus, the lateral layer 112 has a higher electrical resistance than the resistance change layer 111 in the high-resistance state HRS. That is, in any of the states with the oxygen concentration in the lateral layer 112 varied by application of voltage to the first and second conductive layers 101 and 102, the lateral layer 112 has a higher electrical resistance than the resistance change layer 111 (in the high-resistance state HRS).

Also in this case, the resistance change layer 111 and the lateral layer 112 can illustratively be made of an oxide of at least one selected from Si, Ti, Ta, Nb, Hf, Zr, W, Al, Ni, Co, Mn, Fe, Cu, and Mo.

On the other hand, the first conductive layer 101 and the second conductive layer 102 can be made of a material containing an element whose "standard free energy of oxide formation" has a smaller absolute value than that of the element except oxygen contained in the oxide included in the resistance change layer 111 (where the material includes a metal made of the former element, and an alloy, oxide, nitride, and oxynitride containing the former element).

For instance, elements whose "standard free energy of oxide formation" has a smaller absolute value than that of Hf include Ti, Nb, Ta, W, Mo and the like. Elements whose "standard free energy of oxide formation" has a smaller absolute value than that of Ti include Nb, Ta, W, Mo and the like.

Hence, in the case where the resistance change layer 111 is made of an oxide of Hf, the first conductive layer 101 and the second conductive layer 102 can be made of at least one of an oxide, nitride, and oxynitride of Ti, Nb, Ta, W, Mo and the like. In the case where the resistance change layer 111 is made of an oxide of Ti, the first conductive layer 101 and the second conductive layer 102 can be made of at least one of an oxide, nitride, and oxynitride of Nb, Ta, W, Mo and the like.

Furthermore, preferably, the conductive layer serving as an anode (one of the first conductive layer 101 and the second conductive layer 102) is made of a material having high work function, whereas the conductive layer serving as a cathode (the other of the first conductive layer 101 and the second conductive layer 102) is made of a material having low work function. That is, the first conductive layer 101 has a higher work function than the second conductive layer 102.

For instance, in the case where the resistance change layer 111 is made of an oxide of Ti, preferably, the conductive layer serving as an anode is made of W or WN, and the conductive layer serving as a cathode is made of Nb or NbN. By using such a combination between the conductive layer having high work function and the conductive layer having low work function, the band gap of the resistance change layer 111 is bent, allowing the tunneling current to flow easily in the resistance change layer 111 even under a low electric field. Thus, electric field concentration can be caused at a lower electric field, making it possible to reduce the voltage, which is limited by the breakdown voltage of the driving circuit.

In the nonvolatile memory device D151, a clear boundary does not need to exist between the resistance change layer 111 and the lateral layer 112, but in the resistance change layer, it is only necessary that the oxygen concentration is relatively higher on the lateral side than in the center portion in the plane perpendicular to the stacking direction. Thus, the lateral layer can also be regarded as a portion on the lateral side of the resistance change layer where the oxygen concentration is relatively high.

Here, for instance, the diameter (length in a direction perpendicular to the stacking direction) of the portion having low oxygen concentration can be designed to be smaller than the width (length in a direction perpendicular to the stacking direction) of the portion having high oxygen concentration, and the portion having low oxygen concentration can be regarded as the resistance change layer 111 functioning as a filament 111p.

The nonvolatile memory device D151 as described above can be produced illustratively by the following method.

First, a first conductive film 101f, a resistance change film 111f, and a second conductive film 102f are sequentially formed on a substrate 100s in which, for instance, driving circuit elements, as well as wirings, plugs and the like connecting the driving circuit elements to the memory layer 60 are formed. These films can be formed by any of such processes as PVD (physical vapor deposition), CVD, and ALD.

In the film formation of the resistance change film 111f, the electrical resistance of the resistance change layer 111 is adjusted by tuning the oxygen composition. For instance, in the case where the resistance change layer 111 shaped like a cylinder with a diameter of 10 nm and a film thickness of 20 nm is used to form an element in which a current of 10 µA (microamperes) flows at an applied voltage of 0.5 V (volts), the resistance of the cylindrical portion is 50 kΩ, and the resistance change film 111f is formed by tuning the oxygen composition so that, for instance, the resistance change film 111f (resistance change layer 111) has a specific resistance of 20 mΩcm. For instance, when a target containing the constituent element except oxygen of the resistance change film 111f is used to perform chemical sputtering in an atmosphere containing Ar and $O_2$, the specific resistance of the resistance change film 111f (resistance change layer 111) can be adjusted by controlling the partial pressure of $O_2$.

Then, a mask 100r is used to process the first conductive film 101f, the resistance change film 111f, and the second conductive film 102f illustratively by RIE. Thus, the lateral surface of the resistance change film 111f is formed. Then, the lateral surface of the resistance change film 111f is oxidized by heat treatment in an oxidizing atmosphere to form a lateral layer 112.

Here, for instance, in the case where the resistance change layer 111 shaped like a cylinder with a diameter of 10 nm and a film thickness of 20 nm is used to form an element in which a current of 10 µA flows at an applied voltage of 0.5 V, the amount of oxidation of the resistance change film 111f is tuned by the oxygen partial pressure and heat treatment temperature so that a resistance change layer 111 shaped like a cylinder with a diameter of 10 nm and a film thickness of 20 nm is left in the center portion.

Here, the first and second conductive layers 101 and 102 can be made of a material containing an element whose "standard free energy of oxide formation" has a smaller absolute value than that of the element except oxygen contained in the resistance change layer 111 (resistance change film 111f), and the temperature and oxygen partial pressure in the aforementioned oxidation heat treatment of the resistance change film 111f can be suitably selected so that in the oxidation heat treatment, the resistance change film 111f is oxidized, but the first and second conductive layers 101 and 102 are not oxidized. Furthermore, in the aforementioned oxidation heat treatment, only the resistance change film 111f can be selectively oxidized by using a mixed gas of an oxidizing gas and a gas capable of reducing the first and second conductive layers 101 and 102.

Then, an interlayer insulating film is formed between the memory layers 60, and wirings, plugs and the like connecting the driving circuit elements are formed. Thus, the nonvolatile memory device D151 can be fabricated.

In forming the lateral layer 112, protrusions in a direction perpendicular to the stacking direction (Z-axis direction) may be formed from the lateral layer 112 and brought into contact with each other between the adjacent elements (memory layers 60). To suppress this, for instance, before the aforementioned oxidation heat treatment, the resistance change film 111f may be etched by wet processing and the like. This can suppress generation of the aforementioned protrusions.

In the foregoing description, the resistance change layer 111 is shaped like a cylinder, and the lateral surface of the resistance change film 111f is oxidized from all directions in the X-Y plane. However, oxidation may be performed from part of the lateral surface. In this case, for instance, the resistance change layer 111 may not be shaped like a cylinder. Thus, the shape of the resistance change layer 111 is arbitrary.

Figure 18:
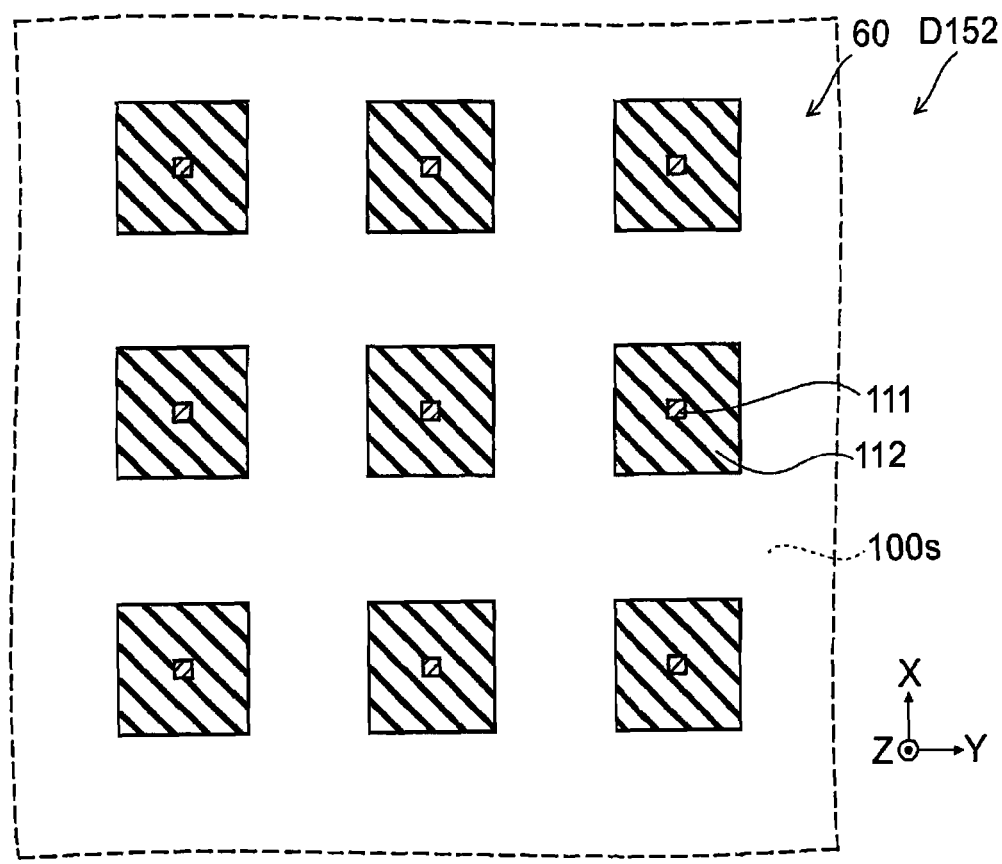
FIG. 18 is a schematic cross-sectional view illustrating the configuration of another nonvolatile memory device according to the seventh embodiment.

FIG. 18 is a schematic cross-sectional view illustrating the configuration of another nonvolatile memory device according to the seventh embodiment of the invention.

More specifically, FIG. 18 is a cross-sectional view corresponding to the cross section taken along line A-A' of FIG. 17A.

As shown in FIG. 18, in another nonvolatile memory device D152 according to this embodiment, the cross-sectional shape of a memory layer 60 (resistance change layer 111 and lateral layer 112) cut along the X-Y plane is rectangular (square in this example).

Thus, the cross section of the resistance change layer 111 and the lateral layer 112 cut along a plane perpendicular to the stacking direction can have an arbitrary shape, such as circles (including oblate circles), rectangles and various other polygons, and polygons with rounded vertices.

For instance, the resistance change layer 111 is patterned by using the mask 100r as described with reference to, for instance, FIGS. 4A to 4D. Here, also in the case where the mask 100r or a mask for forming it is polygonal, for instance, the cross section of the resistance change layer 111 may assume a shape including a curve in the patterning process, and the cross section of the resistance change layer 111 and the lateral layer 112 also assumes a shape including a curve accordingly.

Figure 19A:
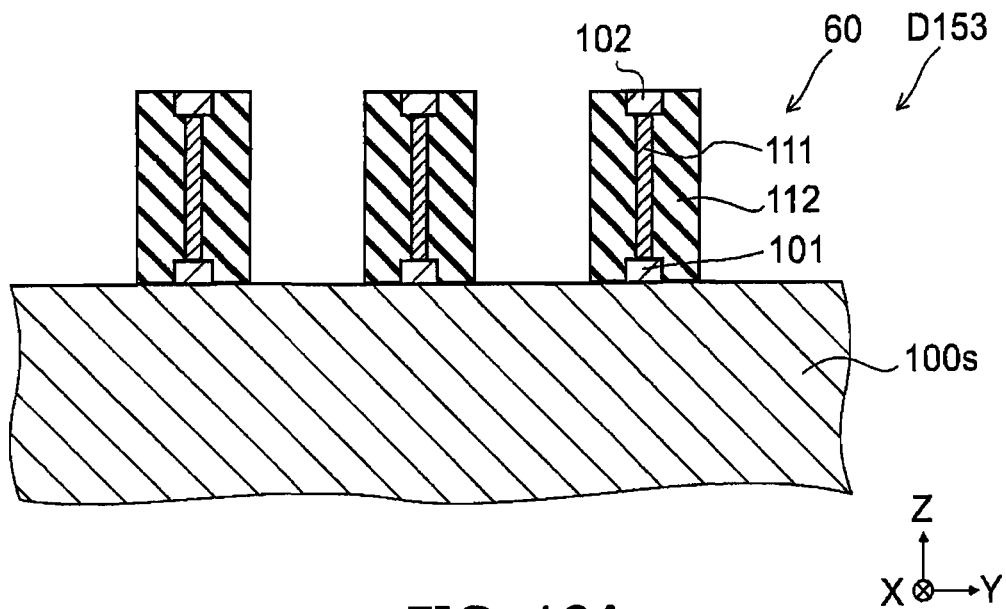
FIGS. 19A and 19B are schematic cross-sectional views illustrating the configurations of other nonvolatile memory devices according to the seventh embodiment.
Figure 19B:
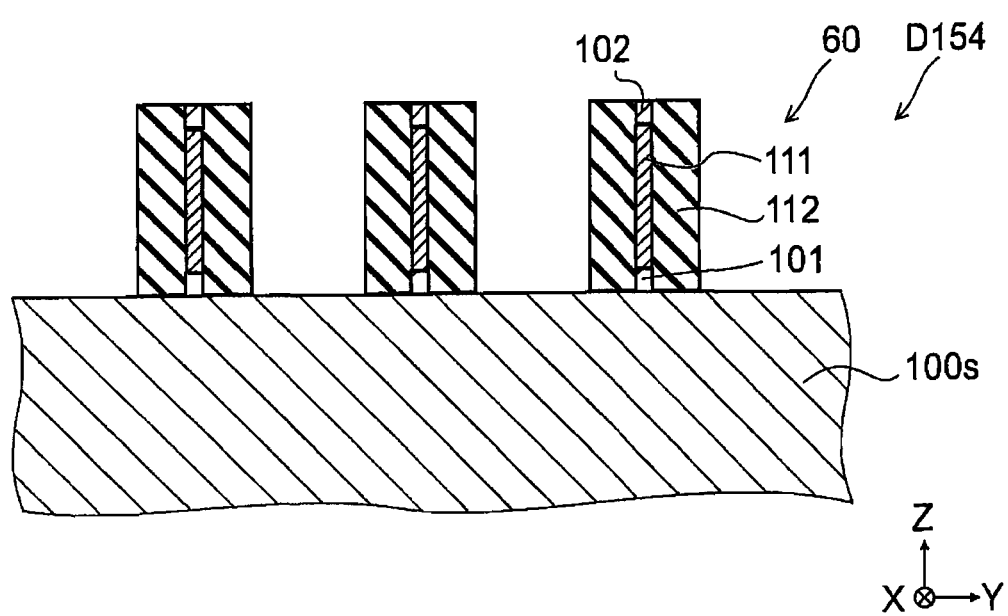

FIGS. 19A and 19B are schematic cross-sectional views illustrating the configurations of other nonvolatile memory devices according to the seventh embodiment of the invention.

More specifically, FIGS. 19A and 19B are cross-sectional views corresponding to the cross section taken along line B-B' of FIG. 17B.

As shown in FIG. 19A, in another nonvolatile memory device D153 according to this embodiment, part of a lateral layer 112 is provided between first and second conductive layers 101 and 102 while being in contact with the lateral surface of a resistance change layer 111, and the other part of the lateral layer 112 is provided in contact with the lateral surface of the first and second conductive layers 101 and 102.

As shown in FIG. 19B, in another nonvolatile memory device D154 according to this embodiment, a lateral layer 112 is not provided between first and second conductive layers 101 and 102, but provided in contact with the lateral surface of a resistance change layer 111 and the lateral surfaces of the first and second conductive layers 101 and 102.

Thus, the lateral layer 112 only needs to be provided in contact with the lateral surface of the resistance change layer 111.

Eighth Embodiment

Figure 20:
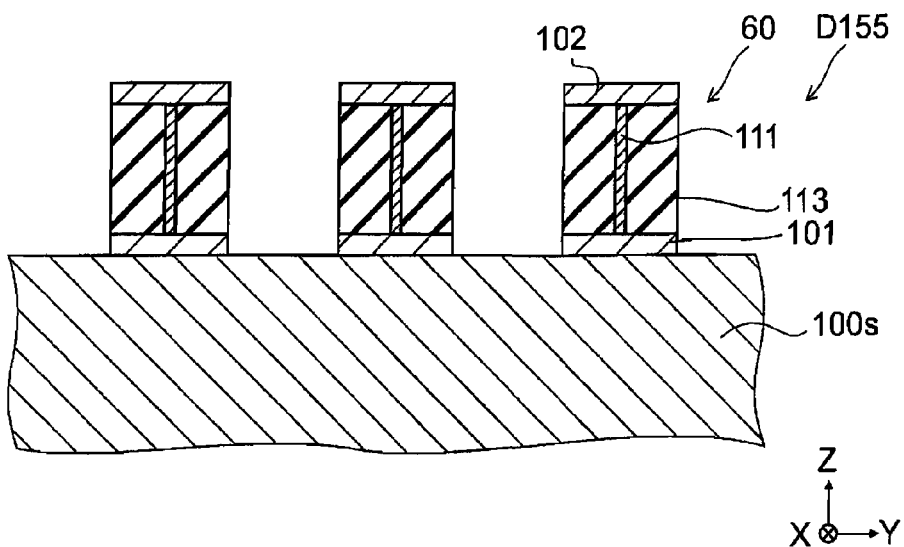
FIG. 20 is a schematic cross-sectional view illustrating the configuration of a nonvolatile memory device according to an eighth embodiment.

FIG. 20 is a schematic cross-sectional view illustrating the configuration of a nonvolatile memory device according to an eighth embodiment of the invention.

More specifically, FIG. 20 is a cross-sectional view corresponding to the cross section taken along line B-B' of FIG. 17B.

As shown in FIG. 20, in a nonvolatile memory device D155 according to this embodiment, the lateral layer 112 (the layer having a higher oxygen concentration than the resistance change layer 111) in the nonvolatile memory device D151 is replaced by a lateral layer 113 (the layer including an oxide having a lower free energy of formation than a resistance change layer 111).

That is, in this example, the lateral layer 113 is made of an oxide having a lower free energy of formation than the element except oxygen contained in the oxide included in the resistance change layer 111.

For instance, the resistance change layer 111 is made of an oxide of Ti, and the lateral layer 113 is made of an oxide of Si. Also in this case, the lateral layer 113 has a higher electrical resistance than the resistance change layer 111.

Thus, as described with reference to the seventh embodiment, the need of the forming process is eliminated. Hence, the efficiency of forming is improved, and the reset current can be reduced. Furthermore, because of the small variation of resistance change in the resistance change layer 111, variation in voltage and current at set and reset time can be suppressed.

Also in this case, the resistance change layer 111 can be narrowly designed so that the resistance change layer 111 has a smaller cross-sectional area than the lateral layer 113. For instance, the length of the resistance change layer 111 in the cross-sectional direction (perpendicular to the Z-axis direction, or the stacking direction) can be designed to be shorter than the length of the lateral layer 113 in the cross-sectional direction.

In the nonvolatile memory device D155, a clear boundary does not need to exist between the resistance change layer 111 and the lateral layer 113. That is, in the resistance change layer, the content of the element whose "standard free energy of oxide formation" has a relatively small absolute value (the element except oxygen) may be higher on the lateral side than in the center portion in the plane perpendicular to the stacking direction. For instance, the lateral layer can also be regarded as a portion on the lateral side of the resistance change layer where the content of the element whose "standard free energy of oxide formation" has a small absolute value is relatively higher than in the center portion.

Here, for instance, the diameter (length in a direction perpendicular to the stacking direction) of the center portion having relatively low content of the element whose "standard free energy of oxide formation" has a small absolute value can be designed to be smaller than the width (length in a direction perpendicular to the stacking direction) of the peripheral portion (lateral layer 113), and this center portion can be regarded as a resistance change layer 111 functioning as a filament 111p.

Also in this case, the oxygen concentration in the lateral layer 113 can be made higher than that in the resistance change layer 111 to further enhance the effect of the lateral layer 113 as an oxygen supply layer for the resistance change layer 111.

Furthermore, also in this case, the first conductive layer 101 and the second conductive layer 102 can be made of a material containing an element whose "standard free energy of oxide formation" has a smaller absolute value than the "standard free energy of oxide formation" of the element except oxygen contained in the oxide included in the resistance change layer 111 and the lateral layer 113 (where the material includes a metal made of the former element, and an alloy, oxide, nitride, and oxynitride containing the former element).

Figure 21:
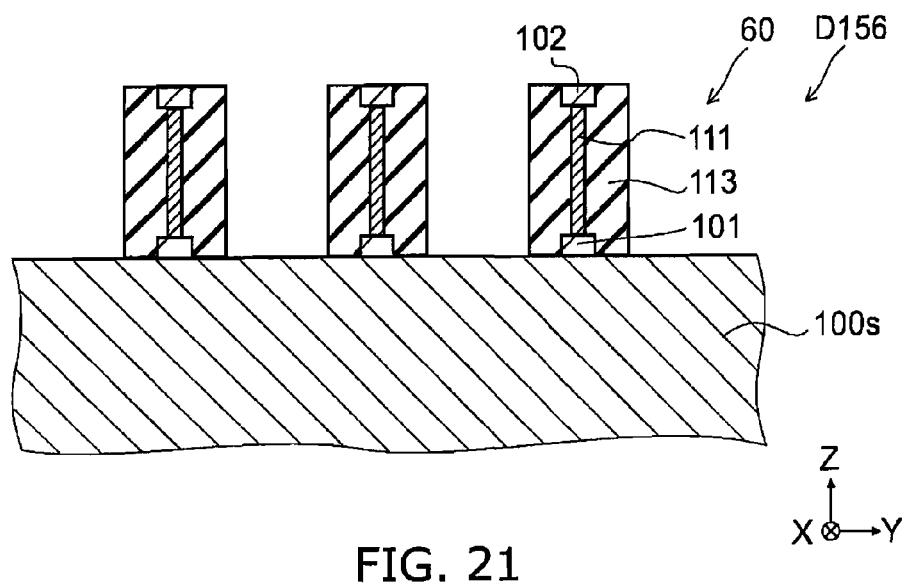
FIG. 21 is a schematic cross-sectional view illustrating the configuration of another nonvolatile memory device according to the eighth embodiment.

FIG. 21 is a schematic cross-sectional view illustrating the configuration of another nonvolatile memory device according to the eighth embodiment of the invention.

More specifically, FIG. 21 is a cross-sectional view corresponding to the cross section taken along line B-B' of FIG. 17B.

As shown in FIG. 21, in another nonvolatile memory device D156 according to this embodiment, part of a lateral layer 113 is provided between first and second conductive layers 101 and 102 while being in contact with the lateral surface of a resistance change layer 111, and the other part of the lateral layer 113 is provided in contact with the lateral surfaces of the first and second conductive layers 101 and 102.

Thus, the lateral layer 113 only needs to be provided in contact with the lateral surface of the resistance change layer 111.

Figure 22:
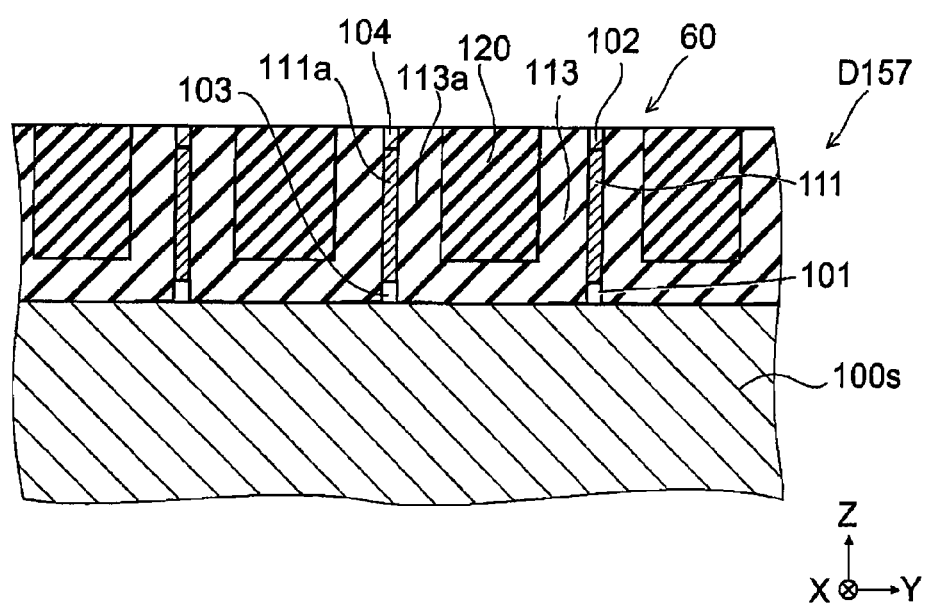
FIG. 22 is a schematic cross-sectional view illustrating the configuration of another nonvolatile memory device according to the eighth embodiment.

FIG. 22 is a schematic cross-sectional view illustrating the configuration of another nonvolatile memory device according to the eighth embodiment of the invention.

More specifically, FIG. 22 is a cross-sectional view corresponding to the cross section taken along line B-B' of FIG. 17B.

As shown in FIG. 22, in another nonvolatile memory device D157 according to this embodiment, a lateral layer 113 is not provided between first and second conductive layers 101 and 102, but provided in contact with the lateral surface of a resistance change layer 111 and the lateral surfaces of the first and second conductive layers 101 and 102.

Furthermore, in this example, the nonvolatile memory device D157 includes an interlayer insulating film 120, as described below, between adjacent memory layers 60.

More specifically, the nonvolatile memory device D157 includes a first conductive layer 101, a second conductive layer 102, a first resistance change layer 111, and a first lateral layer 113 provided on the lateral surface of the first resistance change layer 111 and including an oxide having a lower free energy of formation than the first resistance change layer 111.

The nonvolatile memory device D157 further includes a third conductive layer 103, a fourth conductive layer 104, a second resistance change layer 111a, a second lateral layer 113a provided on the lateral surface of the second resistance change layer 111a on the first lateral layer 113 side, and an interlayer insulating film 120 provided between the first lateral layer 113 and the second lateral layer 113a.

Furthermore, the interlayer insulating film 120 includes an oxide of an element whose "standard free energy of oxide formation" has a smaller absolute value than that of the element except oxygen contained in the oxide included in the first lateral layer 113 and the second lateral layer 113a. That is, the first and second resistance change layers 111 and 111a, the first and second lateral layers 113 and 113a, and the interlayer insulating film 120, are made of oxides of an element with the absolute value of the "standard free energy of oxide formation" decreasing in this order. This allows oxygen contained in the first and second lateral layers 113 and 113a to easily migrate toward the first and second resistance change layers 111 and 111a rather than toward the interlayer insulating film 120.

Furthermore, in the nonvolatile memory device D157, the interlayer insulating film 120 is made of a compound having a lower oxygen concentration than the first lateral layer 113 and the second lateral layer 113a. For instance, the first and second resistance change layers 111 and 111a are made of an oxide of Ti, the first and second lateral layers 113 and 113a are made of a compound of Si ($SiO_{2+\delta}$, where $\delta$ is positive) having a relatively high oxygen concentration, and the interlayer insulating film 120 is made of a compound of Si ($SiO_2$) having a relatively low oxygen concentration. Hence, while maintaining high insulation performance in the interlayer insulating film 120, it is possible to relatively increase the oxygen concentration in the first and second lateral layers 113 and 113a. This allows oxygen contained in the first and second lateral layers 113 and 113a to easily migrate toward the first and second resistance change layers 111 and 111a.

Thus, in the nonvolatile memory device D157 according to this embodiment, the resistance change layer 111 substantially functions as a filament 111p. Hence, the forming process can be omitted. Furthermore, because the interlayer insulating film 120 is made of the material as described above, resetting is further facilitated, and the reset current can be further reduced.

It is noted that also in this case, the resistance change layer 111 can be designed to be narrower than the lateral layer 113.

In this embodiment, the lateral layer 113 (the layer including an oxide having a lower free energy of formation than the resistance change layer 111) may be replaced by a lateral layer 112 (the layer having a higher oxygen concentration than the resistance change layer 111).

The nonvolatile memory device D157 thus configured can illustratively be fabricated on the basis of the method described with reference to FIGS. 6A to 6D. More specifically, a first conductive film 101f, a resistance change film 111f, and a second conductive film 102f are formed in a stacked manner and processed to form the lateral surface of the resistance change film 111f. Then, on these layers, a film, which serves as a lateral layer 113 (lateral layer 112), is formed, and a film, which serves as an interlayer insulating film 120, is formed thereon and between the cells. Then, unnecessary films are removed as appropriate, and wirings, plugs and the like connecting the driving circuit elements are formed. Thus, the nonvolatile memory device D157 is completed.

By this method, even for a cell which is so downscaled that the region for both the resistance change layer 111 and the lateral layer 113 (lateral layer 112) cannot be secured between the first and second conductive layers 101 and 102, the resistance change layer 111 can be provided between the first and second conductive layers 101 and 102, and the lateral layer 113 (lateral layer 112) can be provided in contact with the lateral surface of the resistance change layer 111. Thus, the aforementioned effect can be achieved.

The seventh and eighth embodiments have been described with reference to examples in which the resistance change layer 111 is initially turned into the low-resistance state LRS or the high-resistance state HRS, and the forming process can be omitted. However, the forming process may be performed.

For instance, even in the case where the resistance change layer 111 is initially in the low-resistance state LRS, if the electrical resistance in the low-resistance state LRS or the high-resistance state HRS is varied initially, for instance, at the beginning of the switching operation, the forming process may be performed to reduce this variation. Also in this case, oxygen is supplied from the lateral layer 112 (lateral layer 113) to the resistance change layer 111. Hence, forming is easier than in conventional techniques, and the forming voltage can be reduced. Thus, the electrical resistance of the resistance change layer 111 can be stabilized by simple forming.

Ninth Embodiment

Figure 23A:
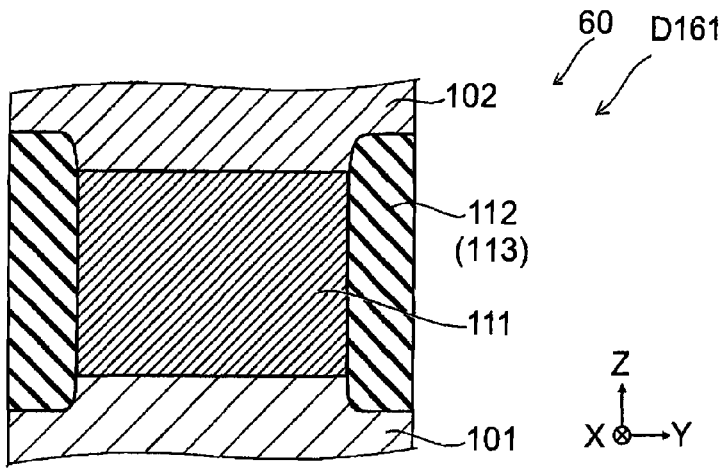
FIGS. 23A to 23C are schematic cross-sectional views illustrating the configurations of nonvolatile memory devices according to a ninth embodiment.
Figure 23B:
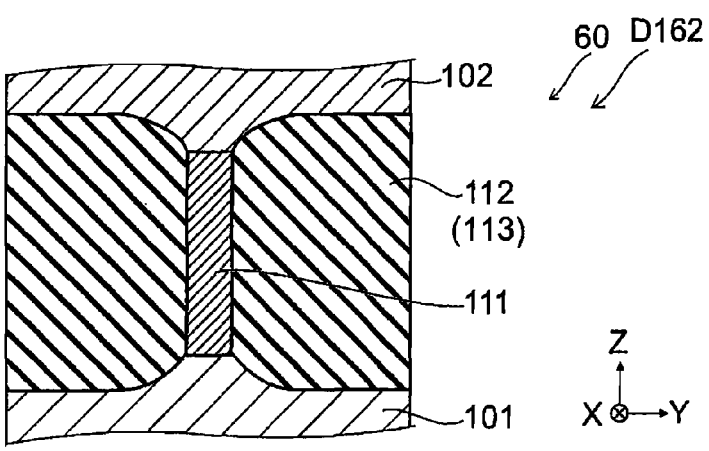
Figure 23C:
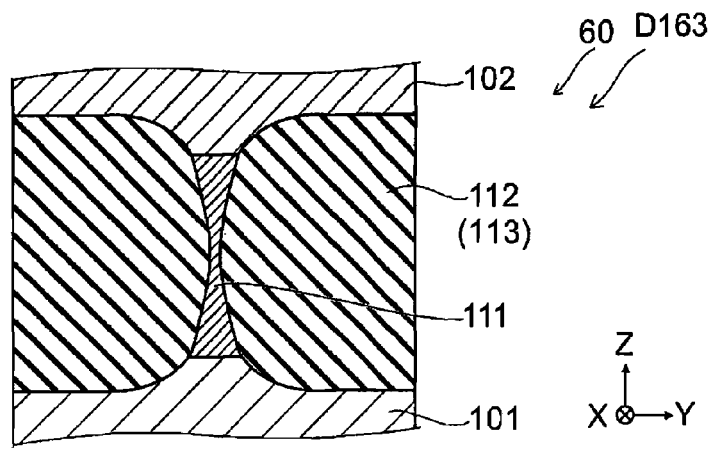

FIGS. 23A to 23C are schematic cross-sectional views illustrating the configurations of nonvolatile memory devices according to a ninth embodiment of the invention.

As shown in FIG. 23A, in a nonvolatile memory device D161 according to this embodiment, the length (thickness) of the resistance change layer 111 in the nonvolatile memory device D101, for instance, in the stacking direction (Z-axis direction) is designed to be shorter (thinner) than the length (thickness) of the lateral layer 112 in the stacking direction. The rest is similar to the nonvolatile memory device D101, and hence the description thereof is omitted.

As shown in FIG. 23B, in another nonvolatile memory device D162 according to this embodiment, the length of a resistance change layer 111 in the stacking direction (Z-axis direction) is designed to be shorter than the length of a lateral layer 112 in the stacking direction, and simultaneously, the length (width) of the resistance change layer 111 in a direction (e.g., X-axis direction or Y-axis direction) perpendicular to the stacking direction is designed to be shorter than the length (width) of the lateral layer 112 in the direction perpendicular to the stacking direction.

In the nonvolatile memory devices D161 and D162, because the thickness of the resistance change layer 111 is thinner than that of the lateral layer 112, the electric field applied by the first and second conductive layers 101 and 102 can be concentrated on the resistance change layer 111, and the current is more likely to flow in the resistance change layer 111 than in the lateral layer 112. Hence, the operating voltage can be reduced, and the operating current can be reduced.

As shown in FIG. 23C, in another nonvolatile memory device D163 according to this embodiment, the length of a resistance change layer 111 in the stacking direction (Z-axis direction) is designed to be shorter than the length of a lateral layer 112 in the stacking direction, and simultaneously, the length of the resistance change layer 111 in a direction (e.g., X-axis direction or Y-axis direction) perpendicular to the stacking direction is designed to be shorter than the length of the lateral layer 112 in the direction perpendicular to the stacking direction. Furthermore, the length of the resistance change layer 111 in the direction perpendicular to the stacking direction is longer on the side of first and second conductive layers 101 and 102 (on the end portion side) than in the center portion. That is, the resistance change layer 111 has a shape constricted in the center portion in the aligning direction (Z-axis direction), and the diameter of the resistance change layer 111 in the center portion is narrower than that in the end portion.

Thus, the thickness of the resistance change layer 111 is made thinner than that of the lateral layer 112, and the center portion of the resistance change layer 111 is made narrower than the end portion, so that oxygen can be efficiently exchanged in the narrowed portion. This further facilitates switching between the high-resistance state HRS and the low-resistance state LRS, and the operating voltage and operating current can be further reduced.

The aforementioned nonvolatile memory devices D161 to D163 have been described with reference to examples based on the lateral layer 112 having a higher oxygen concentration than the resistance change layer 111. However, the lateral layer 112 in the configuration illustrated in FIGS. 23A to 23C may be replaced by a lateral layer 113 including an oxide having a lower free energy of formation than the resistance change layer 111. Also in this case, an effect similar to the foregoing is achieved.

The shape illustrated in FIGS. 23A to 23C, in which the length of the resistance change layer 111 in the stacking direction (Z-axis direction) is shorter than the length of the lateral layer 112 in the stacking direction, can be formed illustratively by a method of using a mixed gas of an oxidizing gas and a gas capable of reducing the first and second conductive layers 101 and 102 in the oxidation heat treatment after processing the resistance change film 111f into a prescribed shape.

Tenth Embodiment

A tenth embodiment of the invention relates to a cross-point nonvolatile memory device. Although this embodiment can be based on any configuration of the nonvolatile memory devices described with reference to the first to ninth embodiments, by way of example, a description is given of the case based on the configuration of the nonvolatile memory device D101.

FIGS. 24A to 24C are schematic views illustrating the configuration of a nonvolatile memory device according to the tenth embodiment of the invention.

More specifically, FIG. 24A is a schematic perspective view, FIG. 24B is a cross-sectional view taken along line A-A' of FIG. 24A, and FIG. 24C is a cross-sectional view taken along line B-B' of FIG. 24A.

As shown in FIGS. 24A to 24C, a nonvolatile memory device D201 includes a plurality of stacked constituent memory layers 66.

Each of the constituent memory layers 66 includes a first wiring 50, a second wiring 80 provided non-parallel to the first wiring 50, and a stacked structure 65 provided between the first wiring 50 and the second wiring 80. Each stacked structure 65 includes a memory layer 60 and a rectifying element 70.

For instance, in the lowermost constituent memory layer 66 of the nonvolatile memory device D201, the first wirings 50 are word lines WL11, WL12, and WL13, and the second wirings 80 are bit lines BL11, BL12, and BL13. For instance, in the lowermost constituent memory layer 66, the first wiring 50 aligns in the X-axis direction, and the second wiring 80 aligns in the Y-axis direction orthogonal to the X-axis direction. The first wiring 50, the second wiring 80, and the stacked structure 65 provided therebetween are stacked in the Z-axis direction orthogonal to the X-axis direction and the Y-axis direction.

In the second lowest constituent memory layer 66, the first wirings 50 are word lines WL21, WL22, and WL23, and the second wirings 80 are bit lines BL11, BL12, and BL13.

Furthermore, in the third lowest constituent memory layer 66, the first wirings 50 are word lines WL21, WL22, and WL23, and the second wirings 80 are bit lines BL21, BL22, and BL23. Furthermore, in the topmost (fourth lowest) constituent memory layer 66, the first wirings 50 are word lines WL31, WL32, and WL33, and the second wirings 80 are bit lines BL21, BL22, and BL23. It is noted that these word lines are generically referred to as "word lines WL", and these bit lines are generically referred to as "bit lines BL".

Although four constituent memory layers 66 are stacked in the nonvolatile memory device D201, the number of stacked constituent memory layers 66 in the nonvolatile memory device according to this embodiment is arbitrary. Such a nonvolatile memory device can be provided on a semiconductor substrate, in which each of the constituent memory layers 66 can be arranged parallel to the major surface of the semiconductor substrate. That is, a plurality of constituent memory layers 66 are stacked parallel to the major surface of the semiconductor substrate.

It is noted that an interlayer insulating film, not shown, is provided between the first wirings 50, between the second wirings 80, and between the stacked structures 65 described above, and between each other.

In FIGS. 24A to 24C, to avoid complication, the first wirings 50 and the second wirings 80 in each of the constituent memory layers 66 are illustrated three for each. However, in the nonvolatile memory device D201 according to this embodiment, the number of first wirings 50 and the number of second wirings 80 are arbitrary, and the number of first wirings 50 may be different from the number of second wirings 80.

Furthermore, the first wirings 50 and the second wirings 80 are shared by the adjacent constituent memory layers 66. More specifically, as illustrated in FIGS. 24A to 24C, the word lines WL21, WL22, and WL23 are shared by the overlying and underlying constituent memory layers 66, and the bit lines BL11, BL12, and BL13 and the bit lines BL21, BL22, and BL23 are shared by the overlying and underlying constituent memory layers 66. However, the invention is not limited thereto. The word lines WL and the bit lines BL may be independently provided in each of the stacked constituent memory layers 66. In the case where the word lines WL and the bit lines BL are independently provided in each of the constituent memory layers 66, the aligning direction of the word line WL and the aligning direction of the bit line BL may be varied for each of the constituent memory layers 66.

In the foregoing, the first wiring 50 is a word line WL, and the second wiring 80 is a bit line BL. However, the first wiring 50 may be a bit line BL, and the second wiring 80 may be a word line WL. That is, the bit line BL and the word line WL are interchangeable. In the following, a description is given of the case where the first wiring 50 is a word line WL, and the second wiring 80 is a bit line BL.

As shown in FIGS. 24B and 24C, in each of the constituent memory layers 66, the stacked structure 65 including the memory layer 60 and the rectifying element 70 is provided at a portion (cross point) where the first wiring 50 and the second wiring 80 cross three-dimensionally. The memory layer 60 at each cross point serves as one memory unit, and the stacked structure 65 including this memory layer 60 serves as one cell.

In the example shown in FIGS. 24B and 24C, the rectifying element 70 is provided on the first wiring 50 side, and the memory layer 60 is provided on the second wiring 80 side. However, the memory layer 60 may be provided on the first wiring 50 side, and the rectifying element 70 may be provided on the second wiring 80 side. Furthermore, the stacking order of the rectifying element 70 and the memory layer 60 with respect to the first wiring 50 and the second wiring 80 may be varied for each of the constituent memory layers 66. Thus, the stacking order of the rectifying element 70 and the memory layer 60 is arbitrary.

The rectifying element 70 can be based on various diodes, such as a pin diode including stacked films made of a polycrystalline silicon layer doped with p-type and n-type impurity, a Schottky diode including a Schottky barrier formed at a metal-semiconductor interface, and an MIM (metal insulator metal) diode having a metal/insulator/metal stacked structure. Alternatively, the rectifying element 70 can be based on transistors and various other rectifying elements. In this example, although the rectifying element 70 is stacked on the memory layer 60 at the intersection between the first wiring 50 and the second wiring 80, the rectifying element 70 may be provided in a portion other than the intersection between the first wiring 50 and the second wiring 80.

The memory layer 60 has one of the configurations described with reference to the aforementioned first to ninth embodiments.

The nonvolatile memory device D201 can further include word lines WL (first wirings 50) and bit lines BL (second wirings 80) provided so as to sandwich the aforementioned resistance change layer 111 (memory layer 60), which is subjected to at least one of application of voltage and passage of current through the word lines WL and the bit lines BL.

At least one of a first conductive layer 101 and a second conductive layer 102 may double as at least one of the word line WL and the bit line BL.

The nonvolatile memory device D201 can further include a rectifying element 70 provided between at least one of the word line WL and the bit line BL on the one hand, and the memory layer 60 including the aforementioned resistance change layer 111 on the other. At least one of the first conductive layer 101 and the second conductive layer 102 may double as at least part of the rectifying element 70.

That is, the configuration of the first conductive layer 101 and the second conductive layer 102 is arbitrary as long as they are conductors having the function of applying voltage to and passing current in the resistance change layer 111.

Figure 25:
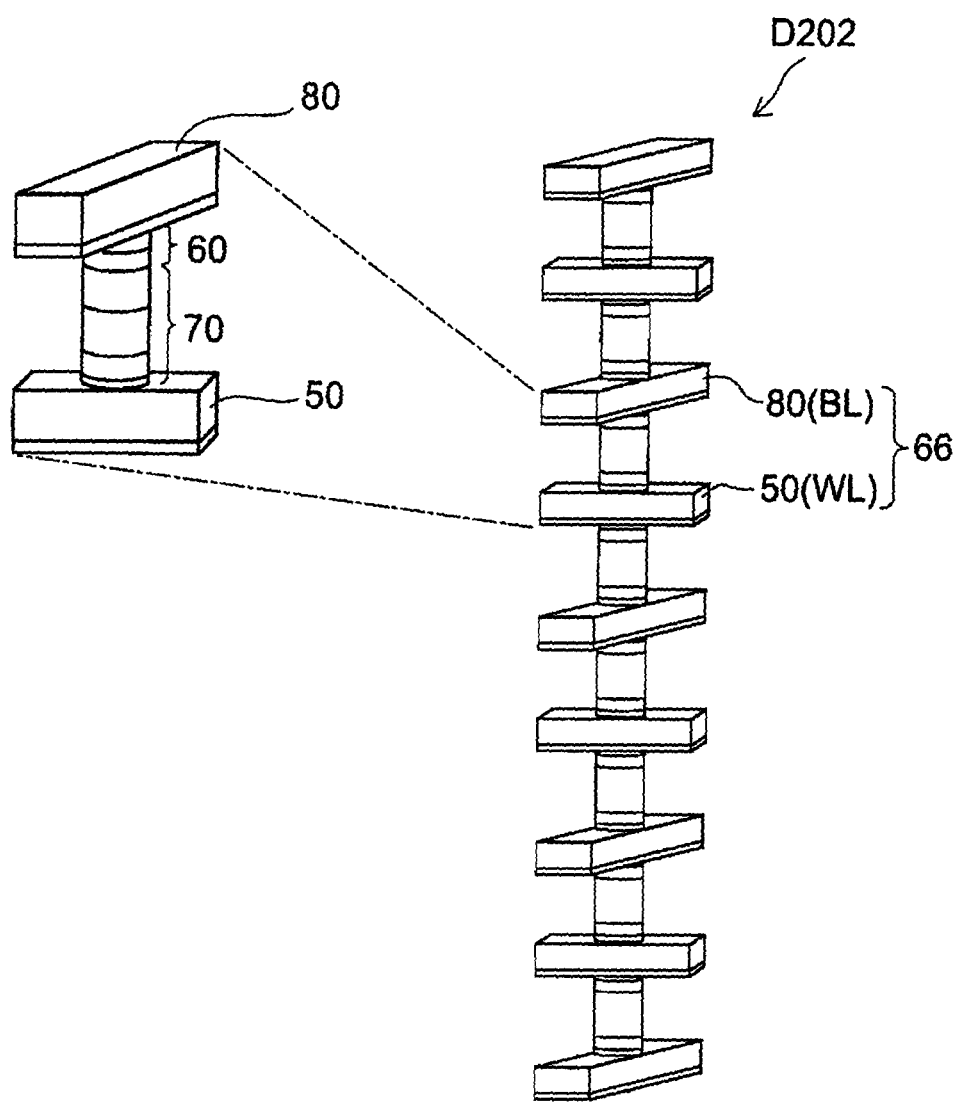
FIG. 25 is a schematic perspective view illustrating the configuration of another nonvolatile memory device according to the tenth embodiment.

FIG. 25 is a schematic perspective view illustrating the configuration of another nonvolatile memory device according to the tenth embodiment of the invention.

As shown in FIG. 25, a nonvolatile memory device D202 according to this embodiment is an example with eight constituent memory layers 66 stacked therein.

The nonvolatile memory device (memory layer 60) of the first to ninth embodiments and a rectifying element 70 are provided between a word line WL and a bit line BL.

Here, the rectifying element 70 at the odd stage and the rectifying element 70 at the even stage are designed to have opposite rectifying characteristics so that the word line WL and the bit line BL are shared at the odd stage and the even stage.

In the nonvolatile memory device D202 having such a structure, the integration density of memory cells can be increased by a relatively simple configuration. Furthermore, because each memory cell includes a rectifying element 70, the bypass current passing through memory cells other than the selected memory cell can be suppressed.

An example method for manufacturing a nonvolatile memory device according to this embodiment is now described. In the following, by way of example, a description is given of the case of using the configuration of the memory layer 60 described with reference to the first embodiment. Furthermore, in this example, a description is given of the case where the first and second conductive layers 101 and 102 do not double as other layers or wirings.

FIGS. 26A to 26F are schematic cross-sectional views in order of the process, illustrating a method for manufacturing a nonvolatile memory device according to the tenth embodiment of the invention.

Figure 26A:
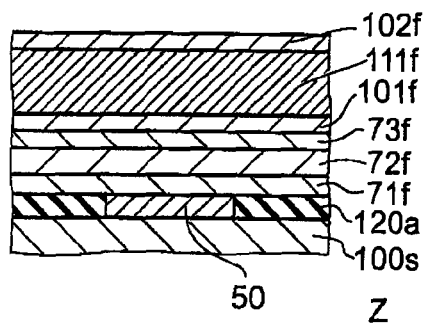
FIGS. 26A to 26F are schematic cross-sectional views in order of the process, illustrating a method for manufacturing a nonvolatile memory device according to the tenth embodiment.
Figure 26B:
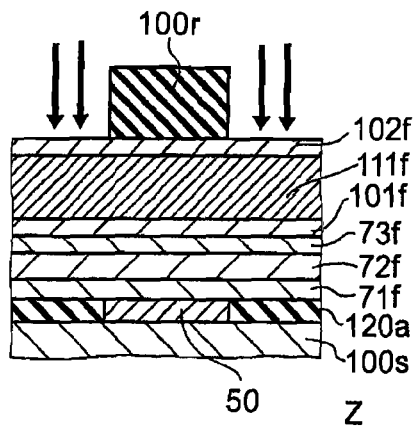
Figure 26C:
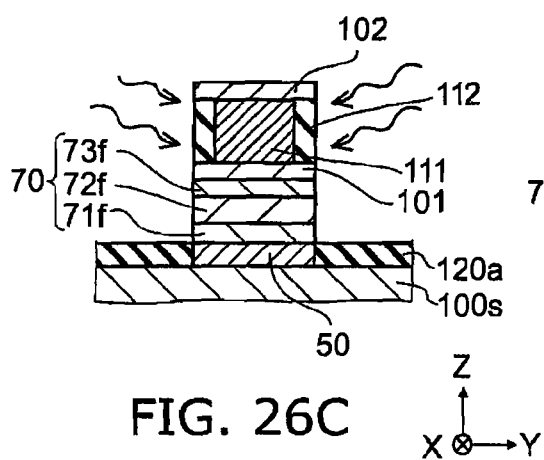
Figure 26D:
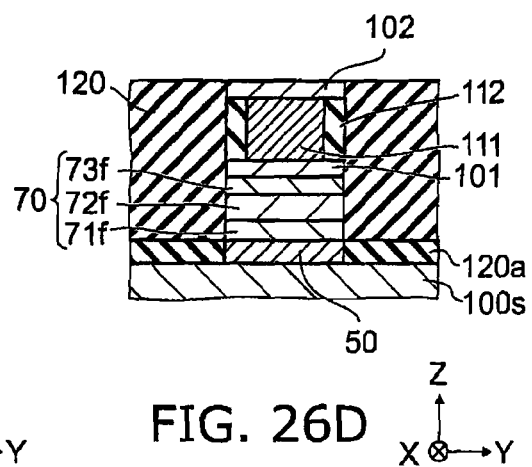
Figure 26E:
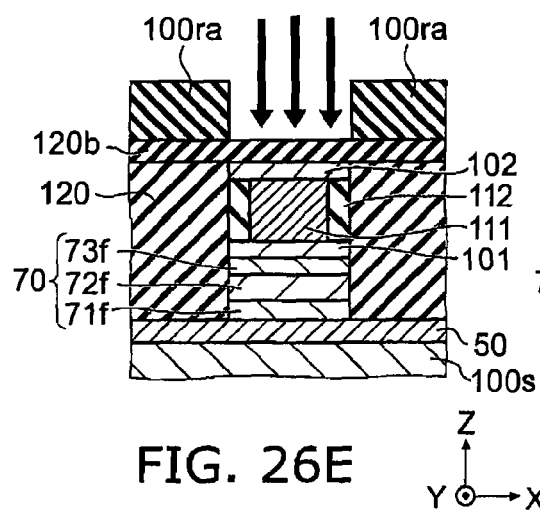
Figure 26F:
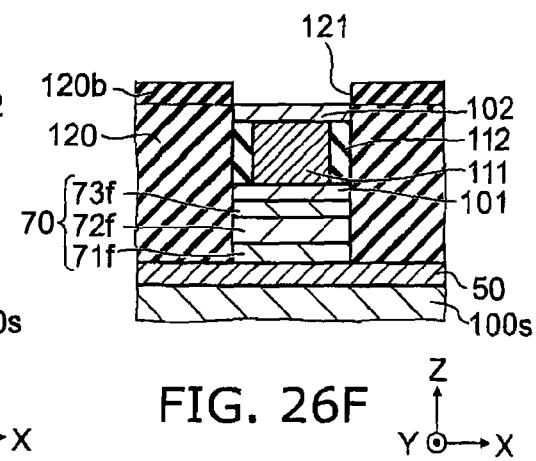

FIGS. 27A to 27E are schematic cross-sectional views in order of the processes continuing from FIG. 26F.

It is noted that the depicted direction of FIGS. 26E and 26F and FIGS. 27A to 27E is rotated 90 degrees around the Z-axis direction from the depicted direction of FIGS. 26A to 26D.

First, as shown in FIG. 26A, first-layer first wirings 50 are formed illustratively on a substrate 100s provided with driving circuit elements (not shown). The first wiring 50 is shaped like a strip aligning illustratively in the X-axis direction, and an interlayer insulating film 120a such as silicon oxide film is buried between the first wirings 50.

A p-type semiconductor film 71f, a polycrystalline silicon film 72f, and an n-type semiconductor film 73f, which are to constitute a rectifying element 70, are stacked on the first wiring 50 and the interlayer insulating film 120a. Subsequently, a first conductive film 101f, a resistance change film 111f, and a second conductive film 102f are stacked.

Subsequently, as shown in FIG. 26B, for instance, by RIE processing using a mask 100r having a prescribed shape, the p-type semiconductor film 71f, the polycrystalline silicon film 72f, the n-type semiconductor film 73f, the first conductive film 101f, the resistance change film 111f, and the second conductive film 102f are processed into a pillar. Thus, the lateral surface of the resistance change film 111f is formed, and a rectifying element 70, a first conductive layer 101, and a second conductive layer 102 are formed.

Then, as shown in FIG. 26C, the lateral surface of the resistance change film 111f is oxidized to form a lateral layer 112 and a resistance change layer 111.

Then, as shown in FIG. 26D, an interlayer insulating film 120 is buried in the gap between the stacked structures each including the rectifying element 70, the first conductive layer 101, the resistance change layer 111, the lateral layer 112, and the second conductive layer 102. The interlayer insulating film 120 can illustratively be a silicon oxide film.

As shown in FIG. 26E, an interlayer insulating film 120b such as silicon oxide film is formed on the interlayer insulating film 120 and the second conductive layer 102, and RIE processing, for instance, is performed using a mask 100ra having a prescribed shape.

Thus, as illustrated in FIG. 26F, a trench 121 aligning in the Y-axis direction is formed in the interlayer insulating film 120b to expose the upper surface of the second conductive layer 102.

Figure 27A:
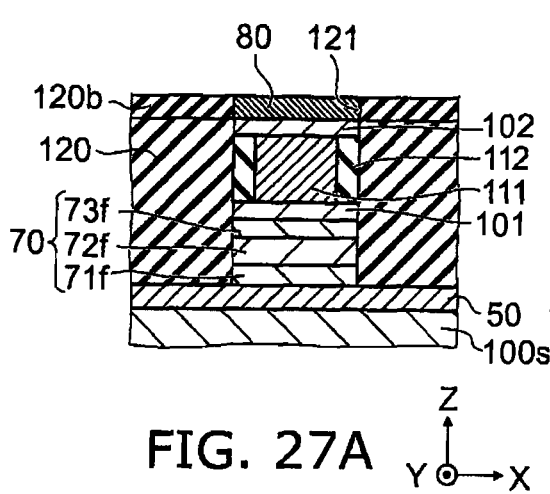
FIGS. 27A to 27E are schematic cross-sectional views in order of the processes continuing from FIG. 26F.

Then, as shown in FIG. 27A, a conductive film is buried in the trench 121 and planarized illustratively by CMP (chemical mechanical polishing) to form a first-layer second wiring 80.

Figure 27B:
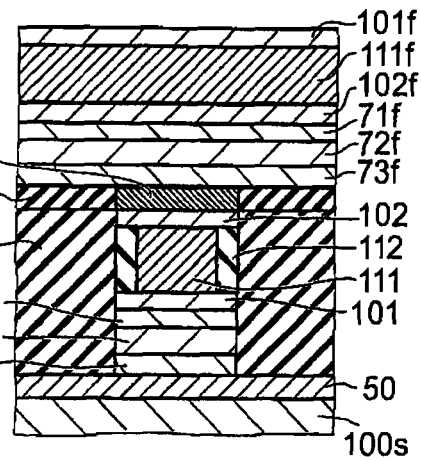

Furthermore, as shown in FIG. 27B, an n-type semiconductor film 73f, a polycrystalline silicon film 72f, and a p-type semiconductor film 71f, which are to constitute a second-layer rectifying element 70, are formed in this order on the second wiring 80 and the interlayer insulating film 120b. Then, a second conductive film 102f, a resistance change film 111f, and a first conductive film 101f are formed thereon.

Here, as described above, the stacking order of the p-type semiconductor film 71f, the polycrystalline silicon film 72f, and the n-type semiconductor film 73f, which constitute the first-layer rectifying element 70, and the stacking order of the p-type semiconductor film 71f, the polycrystalline silicon film 72f, and the n-type semiconductor film 73f, which constitute the second-layer rectifying element 70, are opposite to each other. Furthermore, the stacking order of the first conductive film 101f, the resistance change film 111f, and the second conductive film 102f in the first layer, and the stacking order of the first conductive film 101f, the resistance change film 111f, and the second conductive film 102f in the second layer, are also opposite to each other. Here, the second layer may be formed in the order of, for instance, the second conductive film 102f, the resistance change film 111f, the first conductive film 101f, the n-type semiconductor film 73f, the polycrystalline silicon film 72f, and the p-type semiconductor film 71f.

Figure 27C:
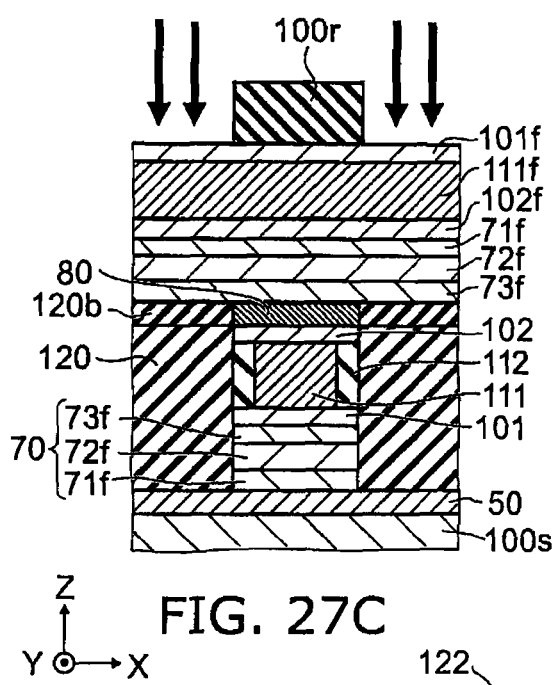

Then, as shown in FIG. 27C, for instance, by RIE processing using a mask 100r having a prescribed shape, the n-type semiconductor film 73f, the polycrystalline silicon film 72f, the p-type semiconductor film 71f, the second conductive film 102f, the resistance change film 111f, and the first conductive film 101f are processed into a pillar. Thus, a rectifying element 70, a first conductive layer 101, and a second conductive layer 102 in the second layer are formed.

Figure 27D:
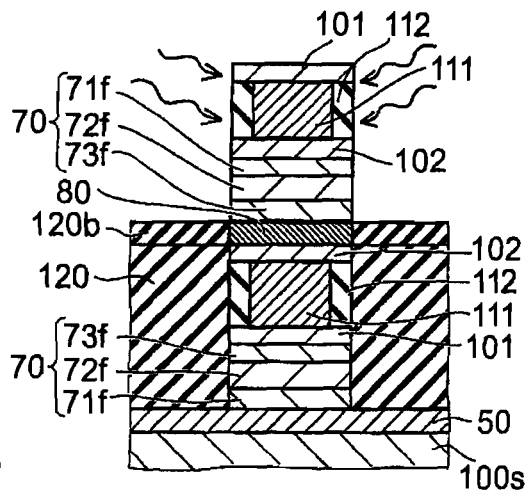

Then, as shown in FIG. 27D, the lateral surface of the resistance change film 111f is oxidized to form a lateral layer 112 and a resistance change layer 111.

Figure 27E:
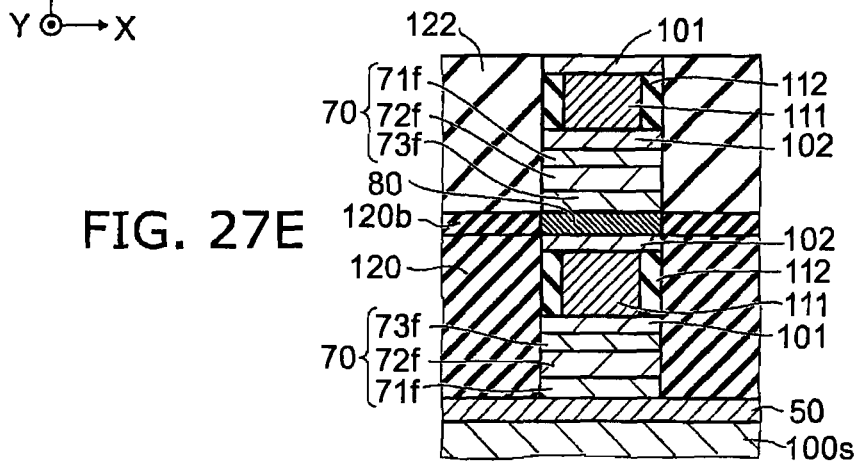

Subsequently, as shown in FIG. 27E, an interlayer insulating film 122 such as silicon oxide film is buried in the gap between the stacked structures each including the rectifying element 70, the first conductive layer 101, the resistance change layer 111, the lateral layer 112, and the second conductive layer 102 in the second layer. Subsequently, second-layer wirings are formed by a similar method.

Then, a necessary number of constituent memory layers 66 are formed by a similar method.

Thus, the nonvolatile memory device D201 and the nonvolatile memory device D202 can be fabricated.

In the nonvolatile memory device D201 and the nonvolatile memory device D202, if the memory layer 60 is based on the configuration other than that of the nonvolatile memory device D101, the aforementioned method is adapted by interchanging the order of processes, changing the condition, or adding necessary processes.

The foregoing has described the method for processing, layer by layer, the stacked films constituting a memory layer 60 (first conductive film 101f, resistance change film 111f, and second conductive film 102f), and the films constituting a rectifying element 70 (e.g., p-type semiconductor film 71f, polycrystalline silicon film 72f, and n-type semiconductor film 73f). However, for instance, two adjacent constituent memory layers 66 may be collectively processed.

For instance, the first wiring film 50f, the films constituting a rectifying element 70, and the stacked films constituting a memory layer 60 in the first layer are processed, for instance, into a strip aligning in the X-axis direction, and an interlayer insulating film is buried between the strips. Then, a first-layer second wiring film 80f, films constituting a second-layer rectifying element 70, stacked films constituting a second-layer memory layer 60, and a second-layer first wiring film 50f are formed. Then, the films constituting a first-layer rectifying element 70, and the stacked films constituting a first-layer memory layer 60, as well as the interlayer insulating film, the first-layer second wiring film 80f, the films constituting a second-layer rectifying element 70, the stacked films constituting a second-layer memory layer 60, and the second-layer first wiring film 50f may be processed along the Y-axis direction, so that the films constituting a first-layer rectifying element 70 and the stacked films constituting a first-layer memory layer 60 are processed into a pillar, whereas the interlayer insulating film, the first-layer second wiring film 80f, the films constituting a second-layer rectifying element 70, the stacked films constituting a second-layer memory layer 60, and the second-layer first wiring film 50f are processed into a strip aligning in the Y-axis direction.

In this case, by performing oxidation treatment of the resistance change film 111f after each processing process, a lateral layer 112 can be formed illustratively on each of the lateral surface parallel to the X-axis direction and the lateral surface parallel to the Y-axis direction.

In the foregoing, a description has been given of the case where the nonvolatile memory device according to this embodiment is a cross-point nonvolatile memory device. However, the embodiment of the invention is not limited thereto. For instance, it is also applicable to a nonvolatile memory device in which a resistance change layer is used in part of a MIS transistor.

For instance, it is possible to further include a MIS (metal insulator semiconductor) transistor including a gate electrode and a gate insulating layer sandwiching the memory layer 60 of the nonvolatile memory device according to one of the first to ninth embodiments so that at least one of application of voltage to the resistance change layer 111 and passage of current in the resistance change layer 111 is performed through the gate electrode.

More specifically, the configuration can further include a first and second second-conductivity-type semiconductor regions provided in a first-conductivity-type semiconductor substrate, a first-conductivity-type semiconductor region between the first and second second-conductivity-type semiconductor regions, and a gate electrode for controlling conduction/non-conduction between the first and second second-conductivity-type semiconductor regions, wherein the memory layer 60 (at least one of the first and second conductive layers 101 and 102, the resistance change layer 111, and the lateral layers 112 and 113) of the nonvolatile memory device according to one of the first to ninth embodiments is located between the gate electrode and the first-conductivity-type semiconductor region, so that at least one of application of voltage to the resistance change layer 111 of the nonvolatile memory device and passage of current in the resistance change layer 111 is performed through the gate electrode.

Thus, the MIS transistor using the resistance change characteristics of the resistance change layer 111 can be used as a memory element.

Thus, the nonvolatile memory device according to the embodiment of the invention can be variously modified.

Eleventh Embodiment

Figure 28:
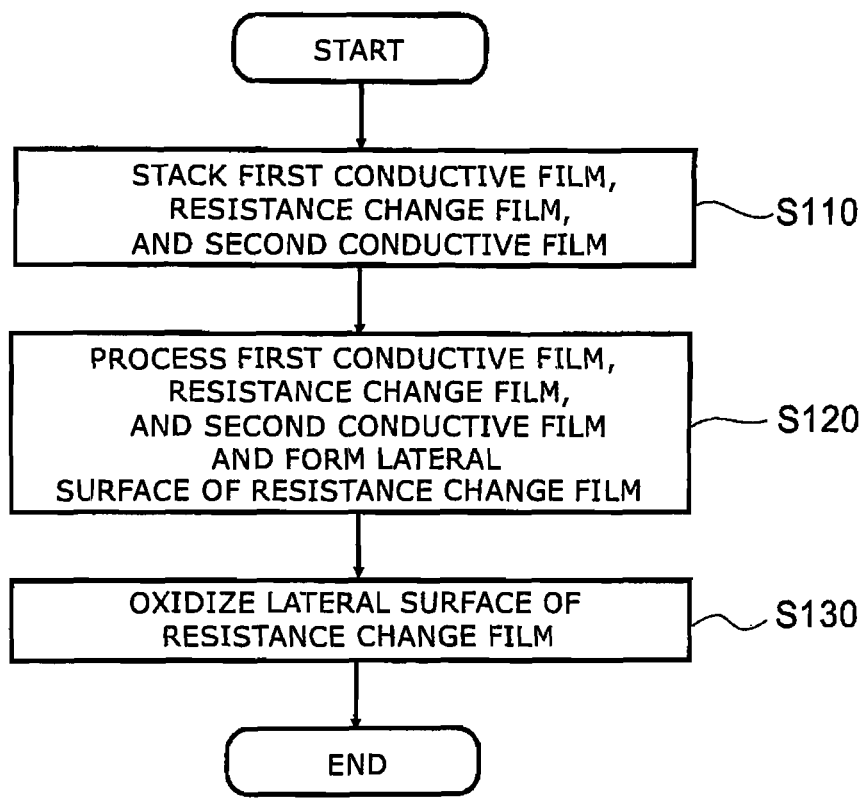
FIG. 28 is a flow chart illustrating a method for manufacturing a nonvolatile memory device according to an eleventh embodiment.

FIG. 28 is a flow chart illustrating a method for manufacturing a nonvolatile memory device according to an eleventh embodiment of the invention.

As shown in FIG. 28, the method for manufacturing a nonvolatile memory device according to this embodiment begins with stacking, on a substrate 100s, a first conductive film 101f serving as a first conductive layer 101, a resistance change film 111f whose electrical resistance changes with at least one of the electric field applied thereto and the current passed therein, and a second conductive film 102f serving as a second conductive layer 102 (step S110). That is, for instance, the processing described with reference to FIG. 4A or 26A is performed.

Here, the resistance change film 111f can be made of various metal oxides described above. The first conductive film 101f and the second conductive film 102f are preferably made of a material containing an element whose "standard free energy of oxide formation" has a smaller absolute value than that of the element except oxygen contained in the oxide included in the resistance change film 111f. This material can include a metal made of a second element whose "standard free energy of oxide formation" has a smaller absolute value than that of a first element except oxygen contained in the oxide included in the resistance change film 111f, and an alloy, oxide, nitride, and oxynitride containing the second element.

Then, the first conductive film 101f, the resistance change film 111f, and the second conductive film 102f are processed to form the lateral surface of the resistance change film 111f (step S120). That is, for instance, the processing described with reference to FIG. 4B or FIG. 26B is performed.

For instance, the first conductive film 101f, the resistance change film 111f, and the second conductive film 102f are cut in a direction parallel to the stacking direction (e.g., Z-axis direction) of the first conductive film 101f, the resistance change film 111f, and the second conductive film 102f. Here, the cutting direction only needs to be non-perpendicular to the stacking direction as long as the resistance change film 111f is exposed.

Then, the exposed lateral surface of the resistance change film 111f is oxidized (step S130). Thus, the oxygen concentration is made higher on the lateral side than in the center portion of the cross section of the resistance change film 111f cut along a plane perpendicular to the stacking direction (e.g., Z-axis direction). For instance, the processing described with reference to FIG. 4C or FIG. 26C is performed.

Thus, a nonvolatile memory device can be manufactured, which includes a lateral layer 112 provided on the lateral surface of the resistance change layer 111 and having a higher oxygen concentration than the resistance change layer 111. That is, a resistance change nonvolatile memory device can be manufactured, in which the forming voltage is reduced, the efficiency of forming is improved, and the reset current is reduced.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described with reference to examples. However, the invention is not limited to these examples. For instance, various specific configurations of the components, such as the conductive layer, conductive film, resistance change layer, resistance change film, lateral layer, interlayer insulating film, memory layer, word line, bit line, wiring, and rectifying element constituting the nonvolatile memory device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the nonvolatile memory device and the method for manufacturing the same described above in the embodiments of the invention, and all the nonvolatile memory devices and methods for manufacturing the same thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention. For instance, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A nonvolatile memory device comprising:
    a first conductive layer;
    a second conductive layer;
    a resistance change layer provided between the first conductive layer and the second conductive layer and having an electrical resistance configured to change with at least one of an applied electric field and a passed current, the resistance change layer having a lateral surface intersecting a plane perpendicular to a first direction from the first conductive layer toward the second conductive layer; and
    a lateral layer contacting the lateral surface of the resistance change layer, a second direction from the lateral layer toward the lateral surface of the resistance change layer being parallel to the plane and the first lateral layer having an oxygen concentration higher than an oxygen concentration in the first resistance change layer,
    the resistance change layer having a first portion, a second portion provided between the first portion and the second conductive layer, and a third portion provided between the first portion and the second portion, and
    a length of the third portion along the second direction being longer than a length of the second portion along the second direction.

2. The device according to claim 1, wherein the resistance change layer includes $A_\alpha M_\beta O_\gamma$, and the lateral layer includes $A_{\alpha 1} M_{\beta 1} O_{\gamma 1}$ ($\gamma 1 > \gamma$), the A being a transition metal element, the M being a transition metal element, the O being oxygen.

3. The device according to claim 1, wherein:
    the first portion is disposed below the second portion in the first direction, and
    a length of the first portion along the second direction is longer than the length of the third portion along the second direction.

4. The device according to claim 3, wherein the resistance change layer includes $A_\alpha M_\beta O_\gamma$, and the lateral layer includes $A_{\alpha 1} M_{\beta 1} O_{\gamma 1}$ ($\gamma 1 > \gamma$), the A being a transition metal element, the M being a transition metal element, the O being oxygen.

5. The device according to claim 3, wherein the first conductive layer is an anode electrode.

6. The device according to claim 3, wherein a side surface of the lateral layer is a curved surface.

7. The device according to claim 6, wherein the lateral layer directly contacts to the first and second conductive layers.

8. The device according to claim 1, wherein:
    the first portion is disposed below the second portion in the first direction, and
    a length of the third portion along the second direction is longer than the length of the first portion along the second direction.

9. The device according to claim 8, wherein the resistance change layer includes $A_\alpha M_\beta O_\gamma$, and the lateral layer includes $A_{\alpha 1} M_{\beta 1} O_{\gamma 1}$ ($\gamma 1 > \gamma$), the A being a transition metal element, the M being a transition metal element, the O being oxygen.

10. The device according to claim 8, wherein a side surface of the lateral layer is a curved surface.

11. The device according to claim 10, wherein the lateral layer directly contacts to the first and second conductive layers.

12. The device according to claim 1, wherein at least part of the lateral layer is provided between the first conductive layer and the second conductive layer.

13. The device according to claim 1, wherein:
    the lateral layer includes a metal oxide having a substantially stoichiometric composition ratio, and
    the resistance change layer includes the metal oxide with a proportion of oxygen reduced to 90% or less as compared with the first lateral layer.

14. The device according to claim 1, wherein the resistance change layer and the lateral layer include an oxide of at least one selected from the group consisting of Si, Ti, Ta, Nb, Hf, Zr, W, Al, Ni, Co, Mn, Fe, Cu, and Mo.

15. The device according to claim 1, wherein the first conductive layer and the second conductive layer include a material containing an element having a smaller absolute value of standard free energy of oxide formation than an element except oxygen contained in an oxide included in the first resistance change layer.

16. The device according to claim 1, wherein the first conductive layer and the second conductive layer include at least one of W, Ta, Cu, TiN, TaN, WC, and highly doped silicon.

17. The device according to claim 1, wherein a work function of the first conductive layer is different from a work function of the second conductive layer.

* * * * *